(12) United States Patent
Kao et al.

(10) Patent No.: US 10,304,677 B2
(45) Date of Patent: May 28, 2019

(54) LOW-K FEATURE FORMATION PROCESSES AND STRUCTURES FORMED THEREBY

(71) Applicant: Taiwan Semiconductor Manufacturing Co., Ltd., Hsinchu (TW)

(72) Inventors: Wan-Yi Kao, Baoshan (TW); Chung-Chi Ko, Jushan Jen (TW); Li Chun Te, Renwu (TW); Hsiang-Wei Lin, New Taipei (TW); Te-En Cheng, Taoyuan (TW); Wei-Ken Lin, Tainan (TW); Guan-Yao Tu, Hsinchu (TW); Shu Ling Liao, Taichung (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/952,895

(22) Filed: Apr. 13, 2018

(65) Prior Publication Data

US 2019/0103265 A1 Apr. 4, 2019

Related U.S. Application Data

(60) Provisional application No. 62/565,755, filed on Sep. 29, 2017.

(51) Int. Cl.
| | |
|---|---|
| *H01L 21/02* | (2006.01) |
| *H01L 29/66* | (2006.01) |
| *H01L 21/311* | (2006.01) |
| *H01L 21/8234* | (2006.01) |
| *H01L 21/266* | (2006.01) |

(Continued)

(52) U.S. Cl.
CPC .... *H01L 21/0228* (2013.01); *H01L 21/02126* (2013.01); *H01L 21/02205* (2013.01); *H01L 21/02208* (2013.01); *H01L 21/31111* (2013.01); *H01L 21/823468* (2013.01); *H01L 29/6656* (2013.01); *H01L 21/266* (2013.01); *H01L 21/26513* (2013.01); *H01L 21/3065* (2013.01); *H01L 21/31053* (2013.01); *H01L 21/76224* (2013.01); *H01L 21/823418* (2013.01); *H01L 21/823431* (2013.01); *H01L 21/823437* (2013.01); *H01L 21/823481* (2013.01); *H01L 29/36* (2013.01); *H01L 29/66545* (2013.01); *H01L 29/66795* (2013.01)

(58) Field of Classification Search
CPC .................................................. H01L 21/0228
USPC ....................................................... 438/696
See application file for complete search history.

(56) References Cited

U.S. PATENT DOCUMENTS

| | | | |
|---|---|---|---|
| 8,465,903 B2 | 6/2013 | Weidman et al. | |
| 2014/0252503 A1* | 9/2014 | Chudzik | H01L 21/0214 257/411 |
| 2017/0092487 A1 | 3/2017 | Kao et al. | |

FOREIGN PATENT DOCUMENTS

| | | |
|---|---|---|
| CN | 103189962 A | 7/2013 |
| TW | 201724175 A | 7/2017 |

* cited by examiner

*Primary Examiner* — Roberts P Culbert
(74) *Attorney, Agent, or Firm* — Slater Matsil, LLP

(57) ABSTRACT

Semiconductor device structures having low-k features and methods of forming low-k features are described herein. Some examples relate to a surface modification layer, which may protect a low-k feature during subsequent processing. Some examples relate to gate spacers that include a low-k (Continued)

feature. Some examples relate to a low-k contact etch stop layer. Example methods are described for forming such features.

20 Claims, 18 Drawing Sheets

(51) Int. Cl.
*H01L 21/265* (2006.01)
*H01L 21/3065* (2006.01)
*H01L 21/3105* (2006.01)
*H01L 21/762* (2006.01)
*H01L 29/36* (2006.01)

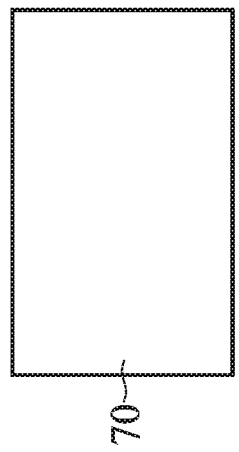
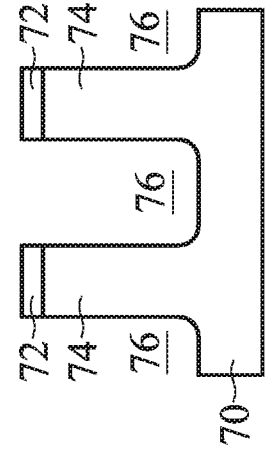
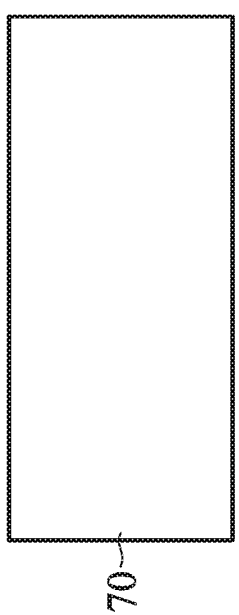
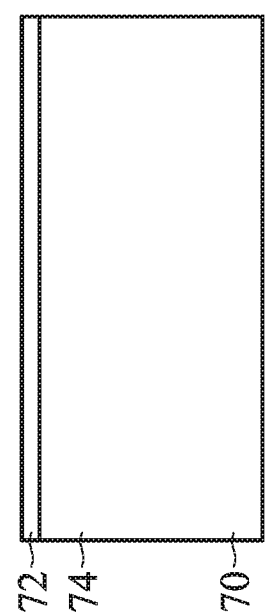

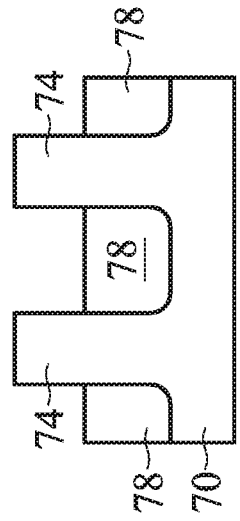
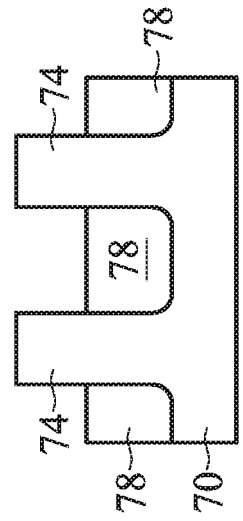
FIG. 4B
FIG. 4A
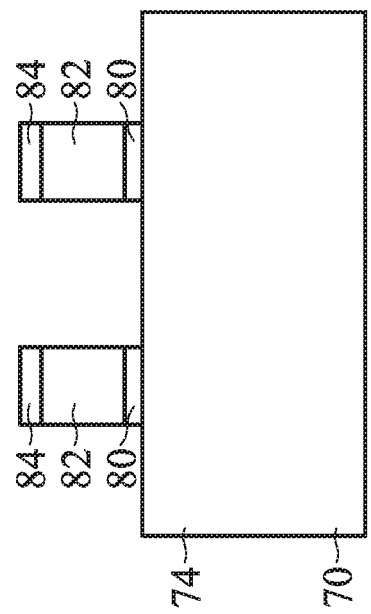
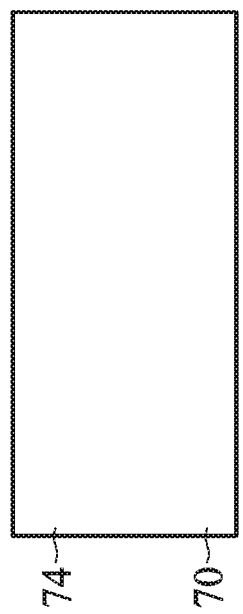
FIG. 5B
FIG. 5A

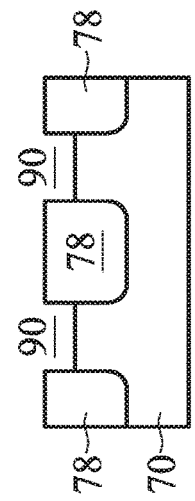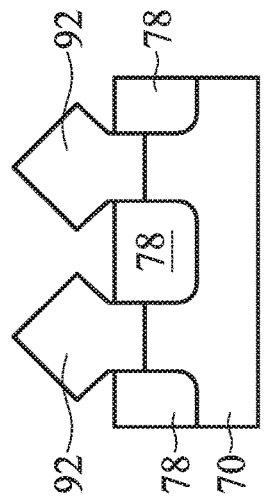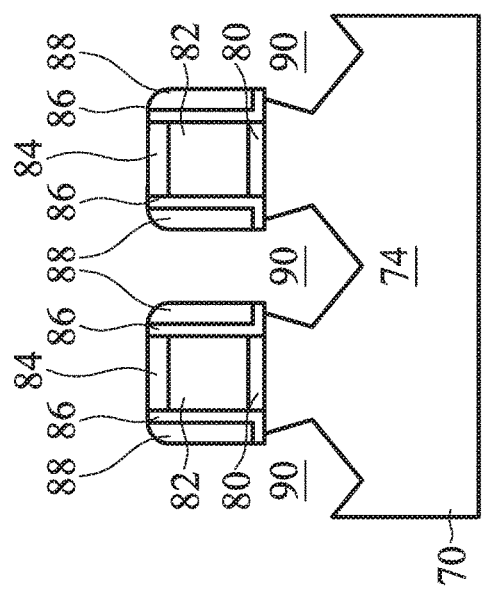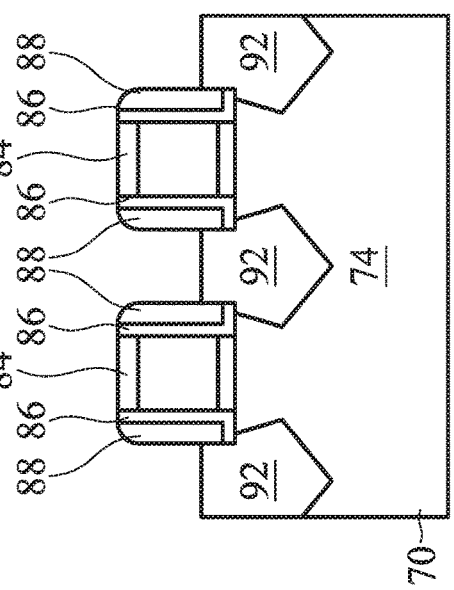

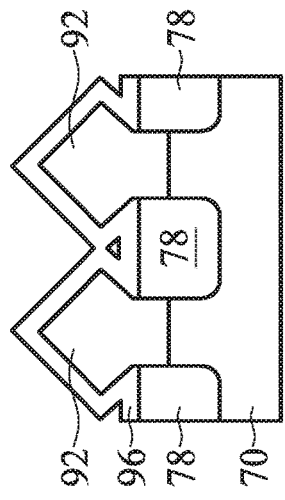
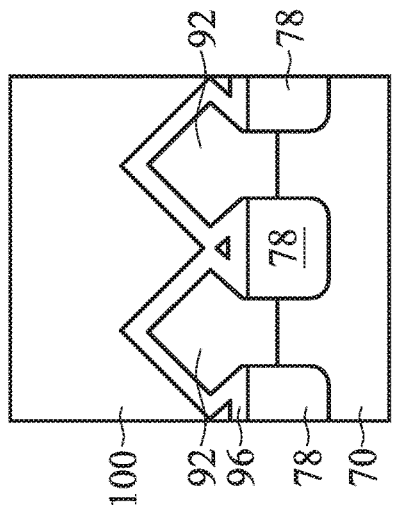
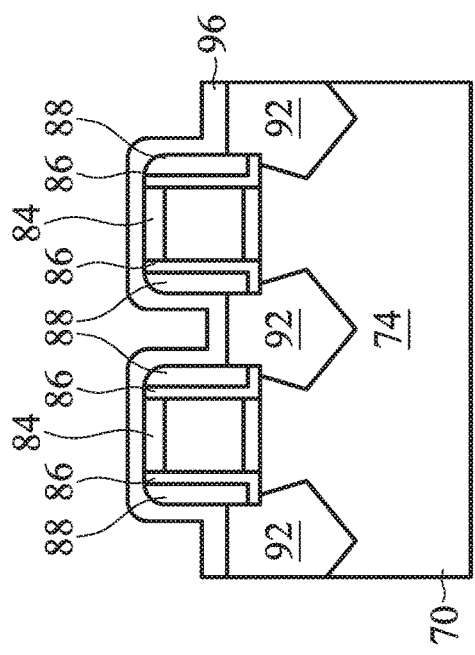
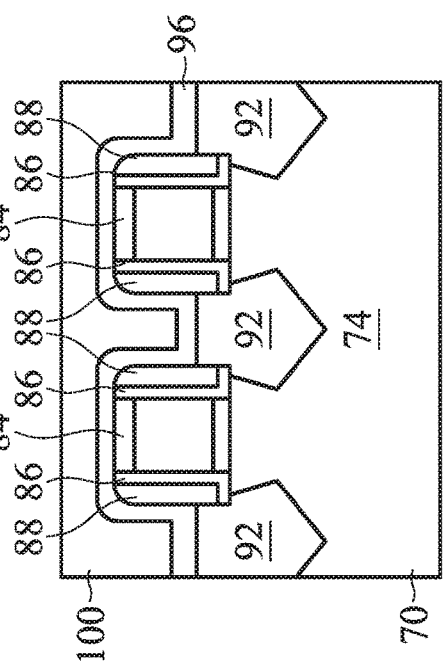

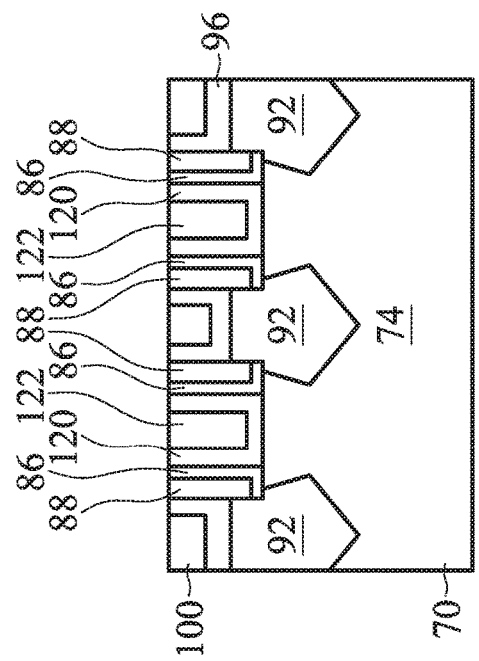
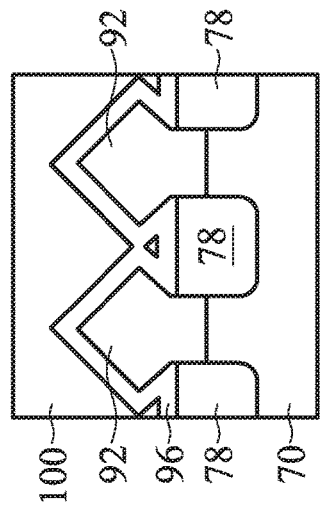
FIG. 14A  FIG. 14B
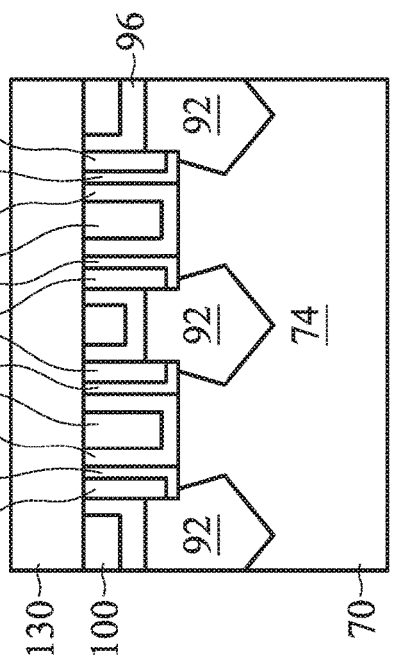
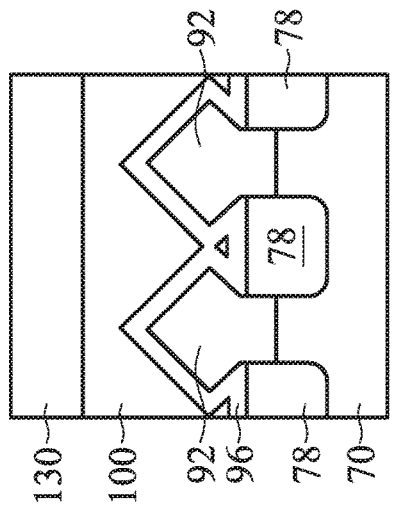
FIG. 15A  FIG. 15B

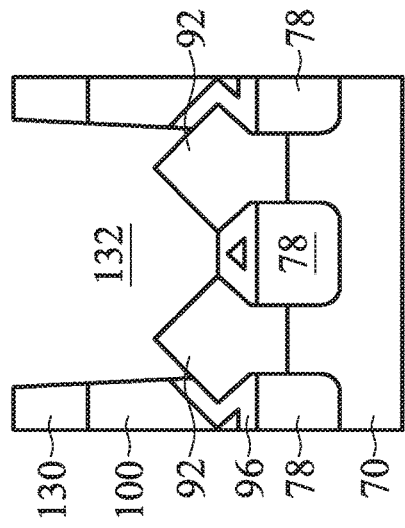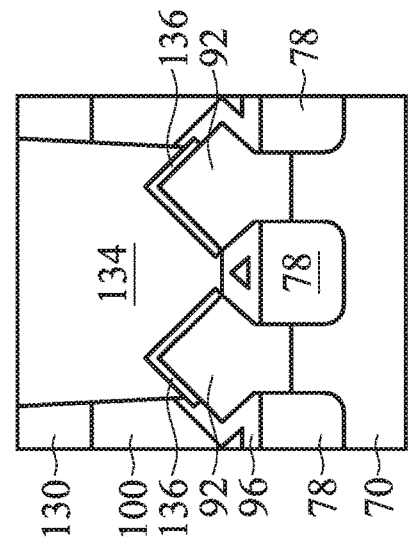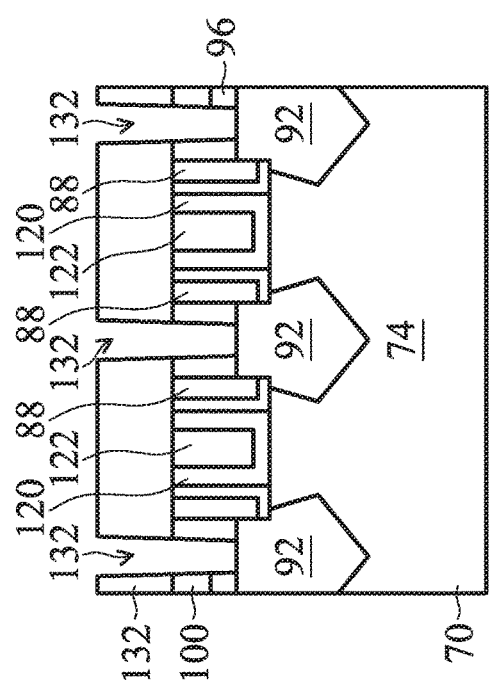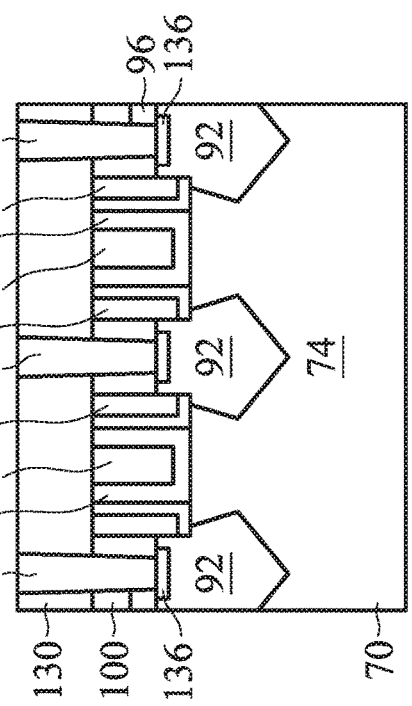
FIG. 16A
FIG. 16B
FIG. 17A
FIG. 17B

LOW-K FEATURE FORMATION PROCESSES AND STRUCTURES FORMED THEREBY

PRIORITY CLAIM AND CROSS-REFERENCE

This application claims the benefit of and priority to U.S. Provisional Patent Application Ser. No. 62/565,755, filed on Sep. 29, 2017, entitled "LOW-K FEATURE FORMATION PROCESSES AND STRUCTURES FORMED THEREBY," which is incorporated herein by reference in its entirety.

BACKGROUND

As the semiconductor industry has progressed into nanometer technology process nodes in pursuit of higher device density, higher performance, and lower costs, challenges from both fabrication and design issues have resulted in the development of three-dimensional designs, such as a Fin Field Effect Transistor (FinFET). FinFET devices typically include semiconductor fins with high aspect ratios and in which channel and source/drain regions are formed. A gate is formed over and along the sides of the fin structure (e.g., wrapping) utilizing the advantage of the increased surface area of the channel to produce faster, more reliable, and better-controlled semiconductor transistor devices. However, with the decreasing in scaling, new challenges are presented.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A-B, 3A-B, 4A-B, 5A-B, 6A-B, 7A-B, 8A-B, 9A-B, 10A-B, 11A-B, 12A-B, and 13A-B are cross-sectional views of respective intermediate structures at intermediate stages in an example process of forming a semiconductor device in accordance with some embodiments.

FIGS. 14A-B, 15A-B, 16A-B, and 17A-B are cross-sectional views of respective intermediate structures at intermediate stages in another example process of forming a semiconductor device in accordance with some embodiments.

DETAILED DESCRIPTION

Figure 1:
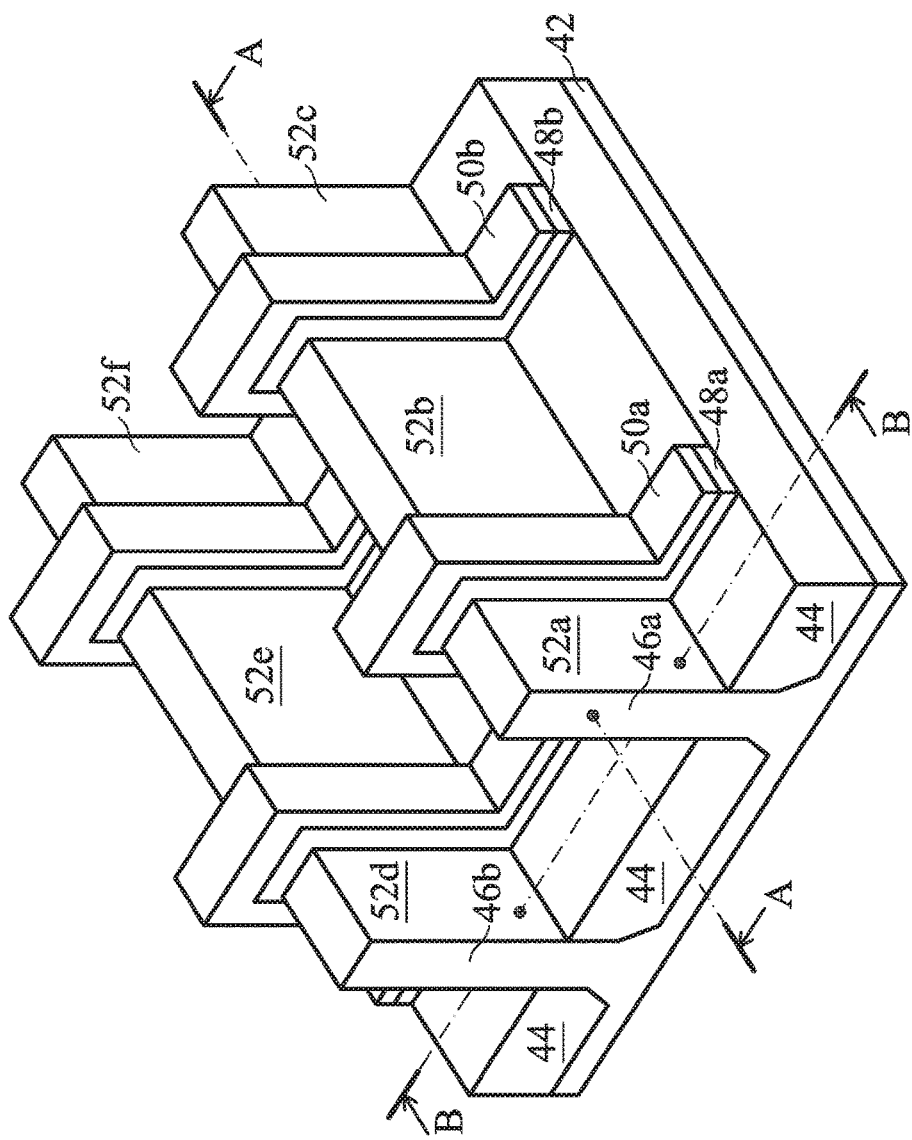
FIG. 1 is a three-dimensional view of example simplified Fin Field Effect Transistors (FinFETs) in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Semiconductor device structures having low-k features and methods of forming low-k features are described herein. Low-k, as used herein, generally refers to a dielectric constant lower than silicon dioxide, such as lower than 4.2, and more particularly, 3.9 or lower. Various low-k features described herein may be implemented in a semiconductor device structure, such as with or without other low-k features described herein. Further, processes for forming low-k features can be implemented with other processes described herein or in other processes and/or contexts. Some aspects of embodiments described herein can enhance a device's performance by lowering a k value in the device, thereby lowering the resistance-capacitance (RC) delay value of the device. Other advantages may be achieved.

In some embodiments, a surface modification layer, such as in a gate spacer structure, has varying concentrations of nitrogen and oxygen, and can be implemented to protect low-k features from subsequent processing, for example. The surface modification layer can be formed using an Atomic Layer Deposition (ALD) process where flow rates of a nitrogen source precursor and an oxygen source precursor in respective pulses are varied through at least some subsequent cycles to achieve the varying concentrations of nitrogen and oxygen in the surface modification layer.

In some embodiments, a low-k layer, such as in a gate spacer structure, has a concentration of oxygen that is greater than a concentration of nitrogen, which is greater than a concentration of carbon. The concentration of nitrogen can be less than ten atomic percent (e.g., greater than zero percent and less than ten atomic percent) at any instance in the low-k layer, and the concentration of carbon can be less than five atomic percent (e.g., greater than zero percent and less than five atomic percent) at any instance in the low-k layer. The low-k layer can be formed using an ALD process with a silicon source precursor, a carbon source precursor, and an oxygen source precursor. The carbon source precursor can include an R functional group.

In some embodiments, a low-k layer, such as in a gate spacer structure, has a concentration of nitrogen that is less than five atomic percent at any instance in the low-k layer. The low-k layer can be formed using ALD process with a silicon and carbon source precursor and an oxygen source precursor. The silicon and carbon source precursor can include an H functional group.

In some embodiments, a multi-layer (e.g., bi-layer) gate spacer structure can be implemented using the surface modification layer along, e.g., a gate stack, and at least one of the low-k layers briefly described above on the surface modification layer. Either or both of the low-k layers may be used in the multi-layer gate spacer structure, which may further include one or more other layers.

In some embodiments, a low-k Contact Etch Stop Layer (CESL) can be implemented in the semiconductor device structure. The low-k CESL can have a concentration of oxygen that is greater than a concentration of nitrogen.

The foregoing broadly outlines some aspects of embodiments described herein. Some embodiments described herein are described in the context of Fin Field Effect Transistors (FinFETs) with certain aspects combined in some embodiments so that those aspects may be clearly, yet briefly, described. Various aspects can be implemented without other aspects described herein. Implementations of some aspects of the present disclosure may be used in other processes, in other devices, and/or for other layers. For example, other example devices can include planar FETs, Horizontal Gate All Around (HGAA) FETs, Vertical Gate All Around (VGAA) FETs, and other devices. Some variations of the example methods and structures are described. A person having ordinary skill in the art will readily understand other modifications that may be made that are contemplated within the scope of other embodiments. Although method embodiments may be described in a particular order, various other method embodiments may be performed in any logical order and may include fewer or more steps than what is described herein.

FIG. 1 illustrates an example of simplified FinFETs 40 in a three-dimensional view. Other aspects not illustrated in or described with respect to FIG. 1 may become apparent from the following figures and description. The structure in FIG. 1 may be electrically connected or coupled in a manner to operate as, for example, one transistor or more, such as four transistors.

The FinFETs 40 comprise fins 46a and 46b on a substrate 42. Isolation regions 44 are on the substrate 42, and the fins 46a and 46b each protrude above and from between neighboring isolation regions 44. Gate dielectrics 48a and 48b are along sidewalls and over top surfaces of the fins 46a and 46b, and gate electrodes 50a and 50b are over the gate dielectrics 48a and 48b, respectively. Source/drain regions 52a-f are disposed in respective regions of the fins 46a and 46b. Source/drain regions 52a and 52b are disposed in opposing regions of the fin 46a with respect to the gate dielectric 48a and gate electrode 50a. Source/drain regions 52b and 52c are disposed in opposing regions of the fin 46a with respect to the gate dielectric 48b and gate electrode 50b. Source/drain regions 52d and 52e are disposed in opposing regions of the fin 46b with respect to the gate dielectric 48a and gate electrode 50a. Source/drain regions 52e and 52f are disposed in opposing regions of the fin 46b with respect to the gate dielectric 48b and gate electrode 50b.

In some examples, four transistors may be implemented by: (1) source/drain regions 52a and 52b, gate dielectric 48a, and gate electrode 50a; (2) source/drain regions 52b and 52c, gate dielectric 48b, and gate electrode 50b; (3) source/drain regions 52d and 52e, gate dielectric 48a, and gate electrode 50a; and (4) source/drain regions 52e and 52f, gate dielectric 48b, and gate electrode 50b. As indicated, some source/drain regions may be shared between various transistors, and other source/drain regions that are not illustrated as being shared may be shared with neighboring transistors that are not illustrated, for example. In some examples, various ones of the source/drain regions may be connected or coupled together such that FinFETs are implemented as two functional transistors. For example, if neighboring (e.g., as opposed to opposing) source/drain regions 52a-f are electrically connected, such as through coalescing the regions by epitaxial growth (e.g., source/drain regions 52a and 52d being coalesced, source/drain regions 52b and 52e being coalesced, etc.), two functional transistors may be implemented. Other configurations in other examples may implement other numbers of functional transistors.

FIG. 1 further illustrates reference cross-sections that are used in later figures. Cross-section A-A is in a plane along, e.g., channels in the fin 46a between opposing source/drain regions 52a-f. Cross-section B-B is in a plane perpendicular to cross-section A-A and is across source/drain region 52a in fin 46a and across source/drain region 52d in fin 46b. Subsequent figures refer to these reference cross-sections for clarity. The following figures ending with an "A" designation illustrate cross-sectional views at various instances of processing corresponding to cross-section A-A, and the following figures ending with a "B" designation illustrate cross-sectional views at various instances of processing corresponding to cross-section B-B. In some figures, some reference numbers of components or features illustrated therein may be omitted to avoid obscuring other components or features; this is for ease of depicting the figures.

FIGS. 2A-B through 13A-B are cross-sectional views of respective intermediate structures at intermediate stages in an example process of forming a semiconductor device in accordance with some embodiments. Aspects of FIGS. 2A-B through 11A-B are applicable to a gate-first process and to a replacement gate process as described herein. FIGS. 12A-B and 13A-B illustrate further aspects of a gate-first process as described herein.

FIGS. 2A and 2B illustrate a semiconductor substrate 70. The semiconductor substrate 70 may be or include a bulk semiconductor substrate, a semiconductor-on-insulator (SOI) substrate, or the like, which may be doped (e.g., with a p-type or an n-type dopant) or undoped. Generally, an SOI substrate comprises a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the semiconductor substrate may include an elemental semiconductor including silicon (Si) or germanium (Ge); a compound semiconductor including silicon carbide, gallium arsenic, gallium phosphide, indium phosphide, indium arsenide, or indium antimonide; an alloy semiconductor including SiGe, GaAsP, AlInAs, AlGaAs, GaInAs, GaInP, or GaInAsP; or a combination thereof.

FIGS. 3A and 3B illustrate the formation of fins 74 on the semiconductor substrate 70. In some examples, a mask 72 (e.g., a hard mask) is used in forming the fins 74. For example, one or more mask layers are deposited over the semiconductor substrate 70, and the one or more mask layers are then patterned into the mask 72. In some examples, the one or more mask layers may include or be silicon nitride, silicon oxynitride, silicon carbide, silicon carbon nitride, the like, or a combination thereof, and may be deposited by chemical vapor deposition (CVD), physical vapor deposition (PVD), ALD, or another deposition technique. The one or more mask layers may be patterned using photolithography. For example, a photo resist can be formed on the one or more mask layers, such as by using spin-on coating, and patterned by exposing the photo resist to light using an appropriate photomask. Exposed or unexposed portions of the photo resist may then be removed depending on whether a positive or negative resist is used. The pattern of the photo resist may then be transferred to the one or more mask layers, such as by using a suitable etch process, which forms the mask 72. The etch process may include a reactive ion etch (RIE), neutral beam etch (NBE), inductive coupled plasma (ICP) etch, the like, or a combination thereof. The etching may be anisotropic. Subsequently, the photo resist is removed in an ashing or wet strip processes, for example.

Using the mask 72, the semiconductor substrate 70 may be etched such that trenches 76 are formed between neighboring pairs of fins 74 and such that the fins 74 protrude from the semiconductor substrate 70. The etch process may include a RIE, NBE, ICP etch, the like, or a combination thereof. The etching may be anisotropic.

FIGS. 4A and 4B illustrate the formation of isolation regions 78, each in a corresponding trench 76. The isolation regions 78 may include or be an insulating material such as an oxide (such as silicon oxide), a nitride, the like, or a combination thereof, and the insulating material may be formed by a high density plasma CVD (HDP-CVD), a flowable CVD (FCVD) (e.g., a CVD-based material deposition in a remote plasma system and post curing to make it convert to another material, such as an oxide), the like, or a combination thereof. Other insulating materials formed by any acceptable process may be used. In the illustrated embodiment, the isolation regions 78 include silicon oxide that is formed by a FCVD process. A planarization process, such as a Chemical Mechanical Polish (CMP), may remove any excess insulating material and any remaining mask (e.g., used to etch the trenches 76 and form the fins 74) to form top surfaces of the insulating material and top surfaces of the fins 74 to be coplanar. The insulating material may then be recessed to form the isolation regions 78. The insulating material is recessed such that the fins 74 protrude from between neighboring isolation regions 78, which may, at least in part, thereby delineate the fins 74 as active areas on the semiconductor substrate 70. The insulating material may be recessed using an acceptable etch process, such as one that is selective to the material of the insulating material. For example, a chemical oxide removal using a CERTAS® etch or an Applied Materials SICONI tool or dilute hydrofluoric (dHF) acid may be used. Further, top surfaces of the isolation regions 78 may have a flat surface as illustrated, a convex surface, a concave surface (such as dishing), or a combination thereof, which may result from an etch process.

A person having ordinary skill in the art will readily understand that the processes described with respect to FIGS. 2A-B through 4A-B are just examples of how fins 74 may be formed. In other embodiments, a dielectric layer can be formed over a top surface of the semiconductor substrate 70; trenches can be etched through the dielectric layer; homoepitaxial structures can be epitaxially grown in the trenches; and the dielectric layer can be recessed such that the homoepitaxial structures protrude from the dielectric layer to form fins. In still other embodiments, heteroepitaxial structures can be used for the fins. For example, the fins 74 can be recessed (e.g., after planarizing the insulating material of the isolation regions 78 and before recessing the insulating material), and a material different from the fins may be epitaxially grown in their place. In an even further embodiment, a dielectric layer can be formed over a top surface of the semiconductor substrate 70; trenches can be etched through the dielectric layer; heteroepitaxial structures can be epitaxially grown in the trenches using a material different from the semiconductor substrate 70; and the dielectric layer can be recessed such that the heteroepitaxial structures protrude from the dielectric layer to form fins. In some embodiments where homoepitaxial or heteroepitaxial structures are epitaxially grown, the grown materials may be in situ doped during growth, which may obviate prior implanting of the fins although in situ and implantation doping may be used together. Still further, it may be advantageous to epitaxially grow a material for an n-type device different from the material for a p-type device.

FIGS. 5A and 5B illustrate the formation of gate stacks on the fins 74. The gate stacks are over and extend laterally perpendicularly to the fins 74. Each gate stack comprises a dielectric layer 80, a gate layer 82, and a mask 84. The gate stacks can be operational gate stacks in a gate-first process or can be dummy gate stacks in a replacement gate process.

In a gate-first process, the dielectric layer 80 may be a gate dielectric, and the gate layer 82 may be a gate electrode. The gate dielectrics, gate electrodes, and mask 84 for the gate stacks may be formed by sequentially forming respective layers, and then patterning those layers into the gate stacks. For example, a layer for the gate dielectrics may include or be silicon oxide, silicon nitride, a high-k dielectric material, the like, or multilayers thereof. A high-k dielectric material can have a k value greater than about 7.0, and may include a metal oxide or silicate of Hf, Al, Zr, La, Mg, Ba, Ti, Pb, multilayers thereof, or a combination thereof. The layer for the gate dielectrics may be thermally and/or chemically grown on the fins 74, or conformally deposited, such as by plasma-enhanced CVD (PECVD), ALD, molecular-beam deposition (MBD), or another deposition technique. A layer for the gate electrodes may include or be silicon (e.g., polysilicon, which may be doped or undoped), a metal-containing material (such as titanium, tungsten, aluminum, ruthenium, or the like), or a combination thereof (such as a silicide or multiple layers thereof). The layer for the gate electrodes may be deposited by CVD, PVD, or another deposition technique. A layer for the mask 84 may include or be silicon nitride, silicon oxynitride, silicon carbon nitride, the like, or a combination thereof, deposited by CVD, PVD, ALD, or another deposition technique. The layers for the mask 84, gate electrodes, and gate dielectrics may then be patterned, for example, using photolithography and one or more etch processes, like described above, to form the mask 84, gate layers 82, and dielectric layers 80 for each gate stack.

In a replacement gate process, the dielectric layer 80 may be an interfacial dielectric, and the gate layer 82 may be a dummy gate. The interfacial dielectric, dummy gate, and mask 84 for the gate stacks may be formed by sequentially forming respective layers, and then patterning those layers into the gate stacks. For example, a layer for the interfacial dielectrics may include or be silicon oxide, silicon nitride, the like, or multilayers thereof, and may be thermally and/or chemically grown on the fins 74, or conformally deposited, such as by PECVD, ALD, or another deposition technique. A layer for the dummy gates may include or be silicon (e.g., polysilicon) or another material deposited by CVD, PVD, or another deposition technique. A layer for the mask 84 may include or be silicon nitride, silicon oxynitride, silicon carbon nitride, the like, or a combination thereof, deposited by CVD, PVD, ALD, or another deposition technique. The layers for the mask 84, dummy gates, and interfacial dielectrics may then be patterned, for example, using photolithography and one or more etch processes, like described above, to form the mask 84, gate layer 82, and dielectric layers 80 for each gate stack.

In some embodiments, after forming the gate stacks, lightly doped drain (LDD) regions (not specifically illustrated) may be formed in the active areas. For example, dopants may be implanted into the active areas using the gate stacks as masks. Example dopants can include or be, for example, boron for a p-type device and phosphorus or arsenic for an n-type device, although other dopants may be used. The LDD regions may have a dopant concentration in a range from about $10^{15}$ cm$^{-3}$ to about $10^{17}$ cm$^{-3}$.

Figure 6B:
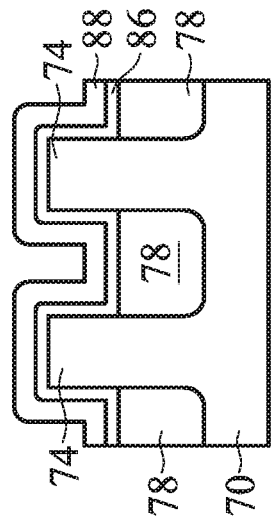
Figure 6A:
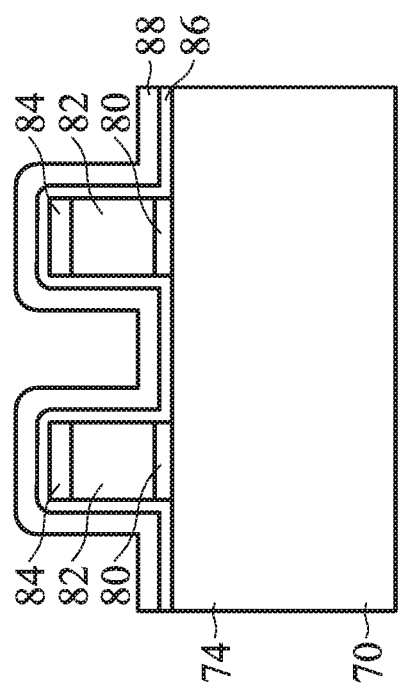

FIGS. 6A and 6B illustrate the formation of a surface modification layer 86 and a low-k gate spacer layer 88 along sidewalls and top surfaces of the gate stacks and the fins 74. The surface modification layer 86 is conformally deposited along sidewalls and top surfaces of the fins 74 and gate stacks (e.g., along sidewalls of dielectric layers 80, gate layers 82, and masks 84, and on top surfaces of masks 84), and on top surfaces of the isolation regions 78. The surface modification layer 86 can be or comprise silicon oxyncarbonitride (SiO$_x$CN$_y$) or another material. In some examples, the surface modification layer 86 can be deposited using an ALD process, although other deposition techniques can be used. A concentration of oxygen in the surface modification layer 86 increases in a direction away from the supporting surface on which the surface modification layer 86 is deposited (e.g., from the sidewall of the gate stack). A concentration of nitrogen in the surface modification layer 86 decreases in a direction away from the supporting surface on which the surface modification layer 86 is deposited (e.g., from the sidewall of the gate stack). Additional details of an example of the surface modification layer 86 and an ALD process for forming the surface modification layer 86 are described below with respect to FIGS. 19 and 20. In some embodiments, the surface modification layer 86 may be omitted.

The low-k gate spacer layer 88 is conformally deposited on the surface modification layer 86. The low-k gate spacer layer 88 can be or comprise silicon oxycarbide (SiOC) or another material. In some examples, the low-k gate spacer layer 88 can be deposited using an ALD process, although other deposition techniques can be used. In some embodiments, an ALD process for depositing the low-k gate spacer layer 88 can use a precursor that includes an R functional group. In those or similar examples, a concentration of nitrogen in the low-k gate spacer layer 88 can be less than ten atomic percent of the low-k gate spacer layer 88, and a concentration of carbon in the low-k gate spacer layer 88 can be less than five atomic percent of the low-k gate spacer layer 88. Further, in those or similar examples, the concentration of oxygen in the low-k gate spacer layer 88 can be greater than the concentration of nitrogen in the low-k gate spacer layer 88, which can be greater than the concentration of carbon in the low-k gate spacer layer 88. In some other embodiments, an ALD process for depositing the low-k gate spacer layer 88 can use a precursor that includes an H functional group, and the ALD process does not include a precursor that includes nitrogen. In those or similar examples, a concentration of nitrogen in the low-k gate spacer layer 88 can be less than five atomic percent of the low-k gate spacer layer 88. Additional details of examples of the low-k gate spacer layer 88 and ALD processes for forming those examples of the low-k gate spacer layer 88 are described below with respect to FIGS. 21, 22, and 24-26. In some embodiments, the low-k gate spacer layer 88 may be omitted.

Figure 7B:
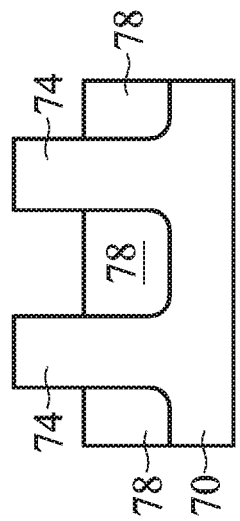
Figure 7A:
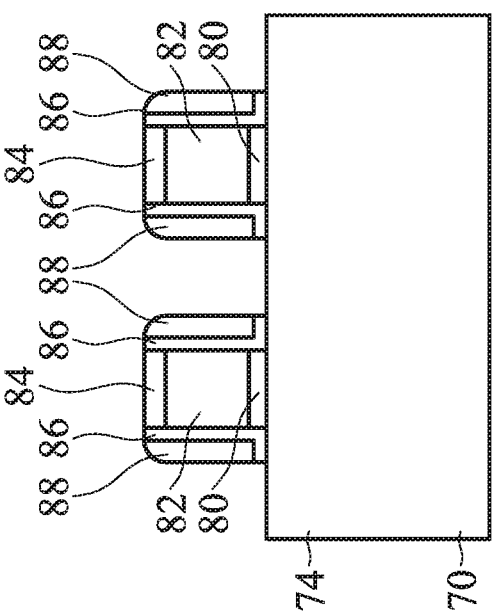

FIGS. 7A and 7B illustrate the formation of multi-layer gate spacers. Multi-layer gate spacers (e.g., bi-layer gate spacers, as illustrated) are formed along sidewalls of the gate stacks (e.g., sidewalls of the dielectric layer 80, gate layer 82, and masks 84) and over the fins 74. Residual multi-layer gate spacers may also be formed along sidewalls of the fins 74, for example, depending on the height of the fins 74 above the isolation regions 78. Such residual multi-layer gate spacers may also be referred to as fin spacers, and may remain along sidewalls of the fins 74, which would be present in the cross-sectional view of FIG. 7B, for example. The multi-layer gate spacers may be formed by anisotropically etching the low-k gate spacer layer 88 and the surface modification layer 86. The etch process can include a RIE, NBE, or another etch process. The multi-layer gate spacers may include additional and/or different layers and/or materials in other embodiments.

FIGS. 8A and 8B illustrate the formation of recesses 90 for source/drain regions. As illustrated, the recesses 90 are formed in the fins 74 on opposing sides of the gate stacks. The recessing can be by an etch process. The etch process can be isotropic or anisotropic, or further, may be selective with respect to one or more crystalline planes of the semiconductor substrate 70. Hence, the recesses 90 can have various cross-sectional profiles based on the etch process implemented. The etch process may be a dry etch, such as a RIE, NBE, or the like, or a wet etch, such as using tetramethyalammonium hydroxide (TMAH), ammonium hydroxide (NH$_4$OH), or another etchant.

FIGS. 9A and 9B illustrate the formation of epitaxy source/drain regions 92 in the recesses 90. The epitaxy source/drain regions 92 may include or be silicon germanium (Si$_x$Ge1-x, where x can be between approximately 0 and 1), silicon carbide, silicon phosphorus, pure or substantially pure germanium, a III-V compound semiconductor, a II-VI compound semiconductor, or the like. For example, materials for forming a III-V compound semiconductor include InAs, AlAs, GaAs, InP, GaN, InGaAs, InAlAs, GaSb, AlSb, AlP, GaP, and the like. The epitaxy source/drain regions 92 may be formed in the recesses 90 by epitaxially growing a material in the recesses 90, such as by metal-organic CVD (MOCVD), molecular beam epitaxy (MBE), liquid phase epitaxy (LPE), vapor phase epitaxy (VPE), selective epitaxial growth (SEG), the like, or a combination thereof. As illustrated in FIGS. 9A and 9B, due to blocking by the isolation regions 78, epitaxy source/drain regions 92 are first grown vertically in recesses 90, during which time the epitaxy source/drain regions 92 do not grow horizontally. After the recesses 90 are fully filled, the epitaxy source/drain regions 92 may grow both vertically and horizontally to form facets, which may correspond to crystalline planes of the semiconductor substrate 70. In some examples, different materials are used for epitaxy source/drain regions for p-type devices and n-type devices. Appropriate masking during the recessing or epitaxial growth may permit different materials to be used in different devices.

A person having ordinary skill in the art will also readily understand that the recessing and epitaxial growth of FIGS. 8A-B and 9A-B may be omitted, and that source/drain regions may be formed by implanting dopants into the fins 74 using the gate stacks and multi-layer gate spacers as masks. In some examples where epitaxy source/drain regions 92 are implemented, the epitaxy source/drain regions 92 may also be doped, such as by in-situ doping during epitaxial growth and/or by implanting dopants into the epitaxy source/drain regions 92 after epitaxial growth. Example dopants can include or be, for example, boron for a p-type device and phosphorus or arsenic for an n-type device, although other dopants may be used. The epitaxy source/drain regions 92 (or other source/drain region) may have a dopant concentration in a range from about $10^{19}$ cm$^{-3}$ to about $10^{21}$ cm$^{-3}$. Hence, a source/drain region may be delineated by doping (e.g., by implantation and/or in situ during epitaxial growth, if appropriate) and/or by epitaxial growth, if appropriate, which may further delineate the active area in which the source/drain region is delineated.

FIGS. 10A and 10B illustrate the formation of a low-k contact etch stop layer (CESL) 96. Generally, an etch stop layer can provide a mechanism to stop an etch process when forming, e.g., contacts or vias. An etch stop layer may be formed of a dielectric material having a different etch selectivity from adjacent layers or components. The low-k CESL 96 is conformally deposited on surfaces of the epitaxy source/drain regions 92, sidewalls and top surfaces of the multi-layer gate spacers, top surfaces of the mask 84, and top surfaces of the isolation regions 78. The low-k CESL 96 may comprise or be any low-k dielectric material, such as silicon oxycarbide, silicon oxycarbonitride, the like, or a combination thereof. In some examples, the concentration of oxygen in the low-k CESL 96 can be greater than the concentration of nitrogen in the low-k CESL 96. The low-k CESL 96 does not include silicon nitride or silicon carbon nitride, in some examples. The low-k CESL 96 may be deposited by ALD, CVD, MBD, or another deposition technique. In some examples, a non-low-k CESL may be implemented instead of or in addition to the low-k CESL 96. A non-low-k CESL may include silicon nitride, silicon carbon nitride, the like, or a combination thereof.

FIGS. 11A and 11B illustrate the formation of a first interlayer dielectric (ILD) 100 over the low-k CESL 96. The first ILD 100 may comprise or be silicon dioxide, a low-k dielectric material, such as silicon oxynitride, phosphosilicate glass (PSG), borosilicate glass (BSG), borophosphosilicate glass (BPSG), undoped silicate glass (USG), fluorinated silicate glass (FSG), organosilicate glasses (OSG), $SiO_xC_y$, Spin-On-Glass, Spin-On-Polymers, silicon carbon material, a compound thereof, a composite thereof, the like, or a combination thereof. The first ILD 100 may be deposited by spin-on, CVD, FCVD, PECVD, PVD, or another deposition technique.

The first ILD 100 may be planarized after being deposited, such as by a CMP. In a gate-first process, a top surface of the first ILD 100 may be above the upper portions of the low-k CESL 96 and the gate stacks. Hence, the upper portions of the low-k CESL 96 may remain over the gate stacks.

Figure 12A:
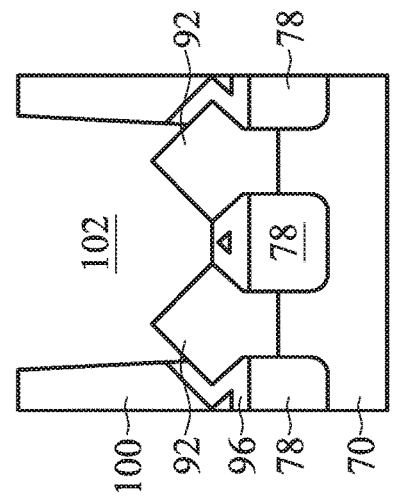
Figure 12B:
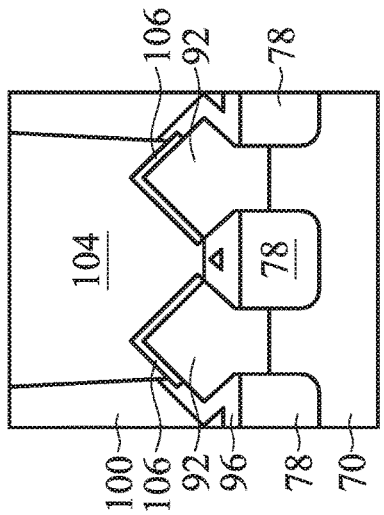

FIGS. 12A and 12B illustrate the formation of openings 102 through the first ILD 100 and the low-k CESL 96 to the epitaxy source/drain regions 92 to expose at least portions of the epitaxy source/drain regions 92, as an example. The first ILD 100 and the low-k CESL 96 may be patterned with the openings 102, for example, using photolithography and one or more etch processes.

Figure 13A:
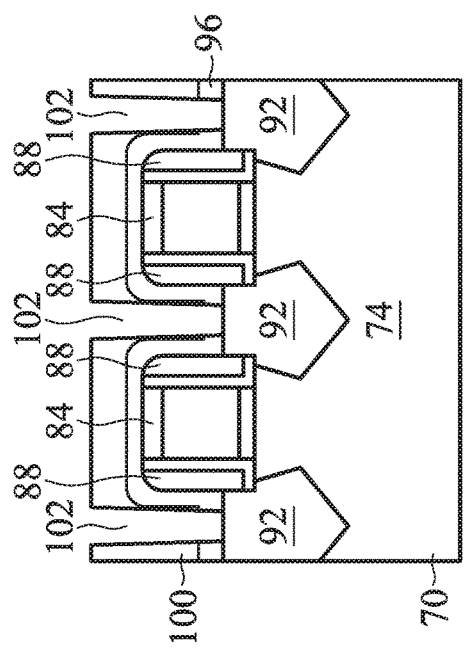
Figure 13B:
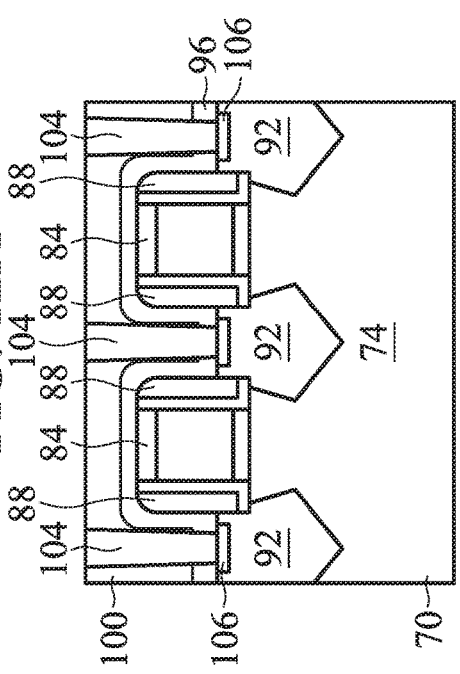

FIGS. 13A and 13B illustrate the formation of conductive features 104 in the openings 102 to the epitaxy source/drain regions 92. The conductive features 104 may include an adhesion and/or barrier layer and conductive material on the adhesion and/or barrier layer, for example. In some examples, the conductive features 104 may include silicide regions 106 on the epitaxy source/drain regions 92, as illustrated. The adhesion and/or barrier layer can be conformally deposited in the openings 102 and over the first ILD 100. The adhesion and/or barrier layer may be or comprise titanium, titanium nitride, titanium oxide, tantalum, tantalum nitride, tantalum oxide, the like, or a combination thereof, and may be deposited by ALD, CVD, or another deposition technique. Silicide regions 106 may be formed on upper portions of the epitaxy source/drain regions 92 by reacting upper portions of the epitaxy source/drain regions 92 with the adhesion and/or barrier layer. An anneal can be performed to facilitate the reaction of the epitaxy source/drain regions 92 with the adhesion and/or barrier layer.

The conductive material can be deposited on the adhesion and/or barrier layer and fill the openings 102. The conductive material may be or comprise tungsten, copper, aluminum, gold, silver, alloys thereof, the like, or a combination thereof, and may be deposited by CVD, ALD, PVD, or another deposition technique. After the material of the conductive features 104 is deposited, excess material may be removed by using a planarization process, such as a CMP, for example. The planarization process may remove excess material of the conductive features 104 from above a top surface of the first ILD 100. Hence, top surfaces of the conductive features 104 and the first ILD 100 may be coplanar. The conductive features 104 may be or may be referred to as contacts, plugs, etc.

FIGS. 14A-B through 17A-B are cross-sectional views of respective intermediate structures at intermediate stages in another example process of forming a semiconductor device in accordance with some embodiments. FIGS. 14A-B and 17A-B illustrate further aspects of a replacement gate process as described herein. Processing is first performed as described above with respect FIGS. 2A-B through 11A-B.

FIGS. 14A and 14B illustrate the replacement of gate stacks with replacement gate structures. The first ILD 100 and low-k CESL 96 are formed with top surfaces coplanar with top surfaces of the gate layers 82. A planarization process, such as a CMP, may be performed to level the top surface of the first ILD 100 and low-k CESL 96 with the top surfaces of the gate layers 82. The CMP may also remove the mask 84 (and, in some instances, upper portions of the multi-layer gate spacers) on the gate layers 82. Accordingly, top surfaces of the gate layers 82 are exposed through the first ILD 100 and the low-k CESL 96.

With the gate layers 82 exposed through the first ILD 100 and the low-k CESL 96, the gate layers 82 and the dielectric layers 80 are removed, such as by one or more etch processes. The gate layers 82 may be removed by an etch process selective to the gate layers 82, wherein the dielectric layers 80 act as etch stop layers, and subsequently, the dielectric layers 80 can be removed by a different etch process selective to the dielectric layers 80. The etch processes can be, for example, a RIE, NBE, a wet etch, or another etch process. Recesses are formed between multi-layer gate spacers where the gate stacks are removed, and channel regions of the fins 74 are exposed through the recesses.

The replacement gate structures are formed in the recesses formed where the gate stacks were removed. The replacement gate structures each include one or more conformal layers 120 and a gate electrode 122. The one or more conformal layers 120 include a gate dielectric layer and may include one or more work-function tuning layers. The gate dielectric layer can be conformally deposited in the recesses where gate stacks were removed (e.g., on top surfaces of the isolation regions 78, sidewalls and top surfaces of the fins 74 along the channel regions, and sidewalls of the multi-layer gate spacers) and on the top surfaces of the first ILD 100, the low-k CESL 96, and multi-layer gate spacers. The gate dielectric layer can be or include silicon oxide, silicon nitride, a high-k dielectric material, multilayers thereof, or other dielectric material. A high-k dielectric material may have a k value greater than about 7.0, and may include a metal oxide of or a metal silicate of Hf, Al, Zr, La, Mg, Ba, Ti, Pb, or a combination thereof. The gate dielectric layer can be deposited by ALD, PECVD, MBD, or another deposition technique.

Then, if implemented, a work-function tuning layer may be conformally deposited on the gate dielectric layer. The work-function tuning layer may include or be tantalum, tantalum nitride, titanium, titanium nitride, the like, or a combination thereof, and may be deposited by ALD, PECVD, MBD, or another deposition technique. Any additional work-function tuning layers may be sequentially deposited similar to the first work-function tuning layer.

A layer for the gate electrodes 122 is formed over the one or more conformal layers 120. The layer for the gate electrodes 122 can fill remaining recesses where the gate stacks were removed. The layer for the gate electrodes 122 may be or comprise a metal-containing material such as Co, Ru, Al, W, Cu. multi-layers thereof, or a combination thereof. The layer for the gate electrodes 122 can be deposited by ALD, PECVD, MBD, PVD, or another deposition technique.

Portions of the layer for the gate electrodes 122 and of the one or more conformal layers 120 above the top surfaces of the first ILD 100, the low-k CESL 96, and multi-layer gate spacers are removed. For example, a planarization process, like a CMP, may remove the portions of the layer for the gate electrodes 122 and the one or more conformal layers 120 above the top surfaces of the first ILD 100, the low-k CESL 96, and multi-layer gate spacers. The replacement gate structures comprising the gate electrodes 122 and one or more conformal layers 120 may therefore be formed as illustrated in FIG. 14A.

FIGS. 15A and 15B illustrate the formation of a second ILD 130 over the first ILD 100, replacement gate structures, multi-layer gate spacers, and low-k CESL 96. Although not illustrated, in some examples, an etch stop layer may be deposited over the first ILD 100, etc., and the second ILD 130 may be deposited over the ESL. If implemented, the etch stop layer may comprise or be silicon nitride, silicon carbon nitride, silicon carbon oxide, carbon nitride, the like, or a combination thereof, and may be deposited by CVD, PECVD, ALD, or another deposition technique. The second ILD 130 may comprise or be silicon dioxide, a low-k dielectric material, such as silicon oxynitride, PSG, BSG, BPSG, USG, FSG, OSG, $SiO_xC_y$, Spin-On-Glass, Spin-On-Polymers, silicon carbon material, a compound thereof, a composite thereof, the like, or a combination thereof. The second ILD 130 may be deposited by spin-on, CVD, FCVD, PECVD, PVD, or another deposition technique.

FIGS. 16A and 16B illustrate the formation of openings 132 through the second ILD 130, the first ILD 100, and the low-k CESL 96 to the epitaxy source/drain regions 92 to expose at least portions of the epitaxy source/drain regions 92, as an example. The second ILD 130, the first ILD 100, and the low-k CESL 96 may be patterned with the openings 132, for example, using photolithography and one or more etch processes.

FIGS. 17A and 17B illustrate the formation of conductive features 134 in the openings 132 to the epitaxy source/drain regions 92. The conductive features 134 may include an adhesion and/or barrier layer and conductive material on the adhesion and/or barrier layer, for example. In some examples, the conductive features 134 may include silicide regions 136 on the epitaxy source/drain regions 92, as illustrated. The adhesion and/or barrier layer can be conformally deposited in the openings 132 and over the second ILD 130. The adhesion and/or barrier layer may be or comprise titanium, titanium nitride, titanium oxide, tantalum, tantalum nitride, tantalum oxide, the like, or a combination thereof, and may be deposited by ALD, CVD, or another deposition technique. Silicide regions 136 may be formed on upper portions of the epitaxy source/drain regions 92 by reacting upper portions of the epitaxy source/drain regions 92 with the adhesion and/or barrier layer. An anneal can be performed to facilitate the reaction of the epitaxy source/drain regions 92 with the adhesion and/or barrier layer.

The conductive material can be deposited on the adhesion and/or barrier layer and fill the openings 132. The conductive material may be or comprise tungsten, copper, aluminum, gold, silver, alloys thereof, the like, or a combination thereof, and may be deposited by CVD, ALD, PVD, or another deposition technique. After the material of the conductive features 134 is deposited, excess material may be removed by using a planarization process, such as a CMP, for example. The planarization process may remove excess material of the conductive features 134 from above a top surface of the first ILD 130. Hence, top surfaces of the conductive features 134 and the second ILD 130 may be coplanar. The conductive features 134 may be or may be referred to as contacts, plugs, etc.

Figure 18:
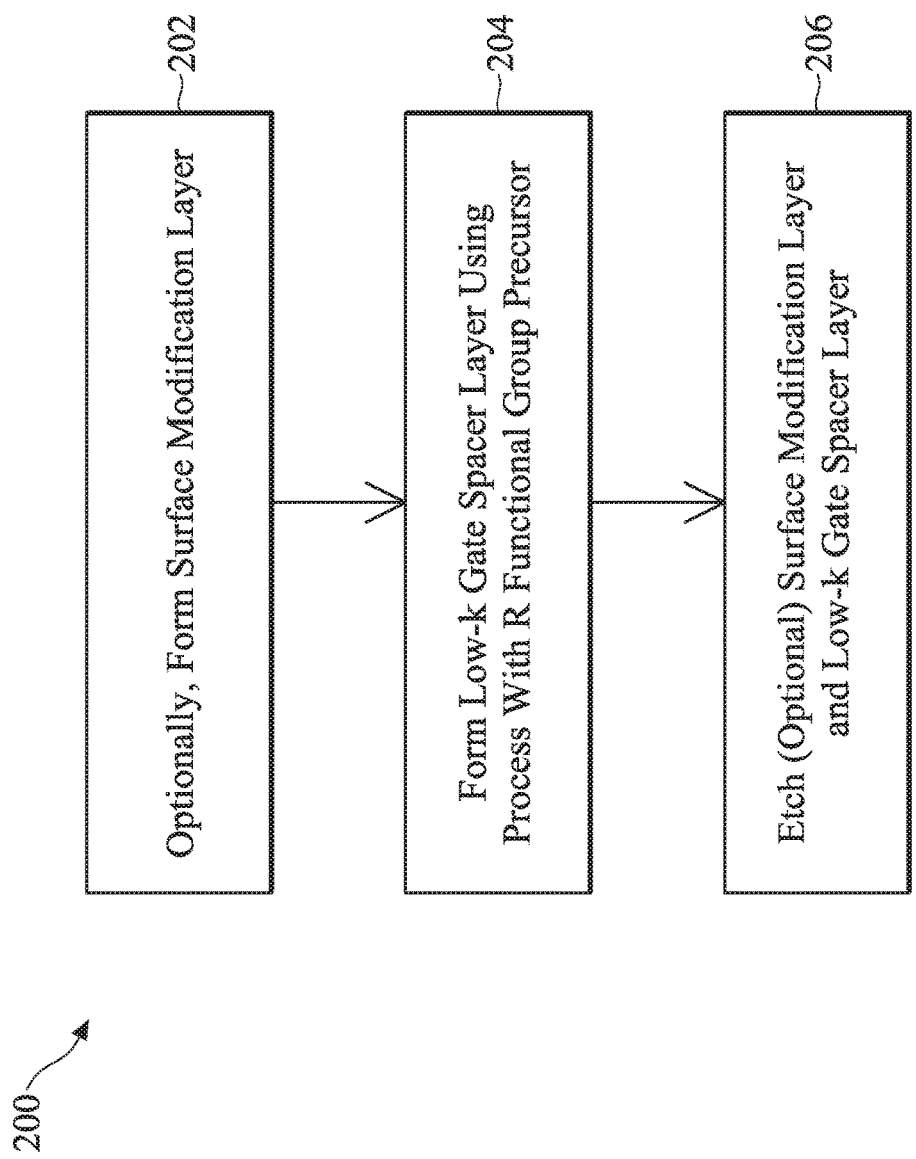
FIG. 18 is a process flow for forming a gate spacer in accordance with some embodiments.

FIG. 18 is a process flow 200 for forming a gate spacer (e.g., a multi-layer gate spacer) in accordance with some embodiments. In operation 202, optionally, a surface modification layer is formed on a device structure, such as generally illustrated in and described with respect to FIGS. 6A and 6B. This operation 202 may be omitted. In operation 204, a low-k gate spacer layer is formed using a process that uses an R functional group precursor. The low-k gate spacer layer may be formed on the surface modification layer, if optionally implemented, or on the device structure, for example. Generally, the formation of the low-k gate spacer layer is illustrated in and described with respect to FIGS. 6A and 6B. In operation 206, the low-k gate spacer layer and, if implemented, the surface modification layer are anisotropically etched to form the gate spacer, such as generally illustrated in and described with respect to FIGS. 7A and 7B.

Figure 19:
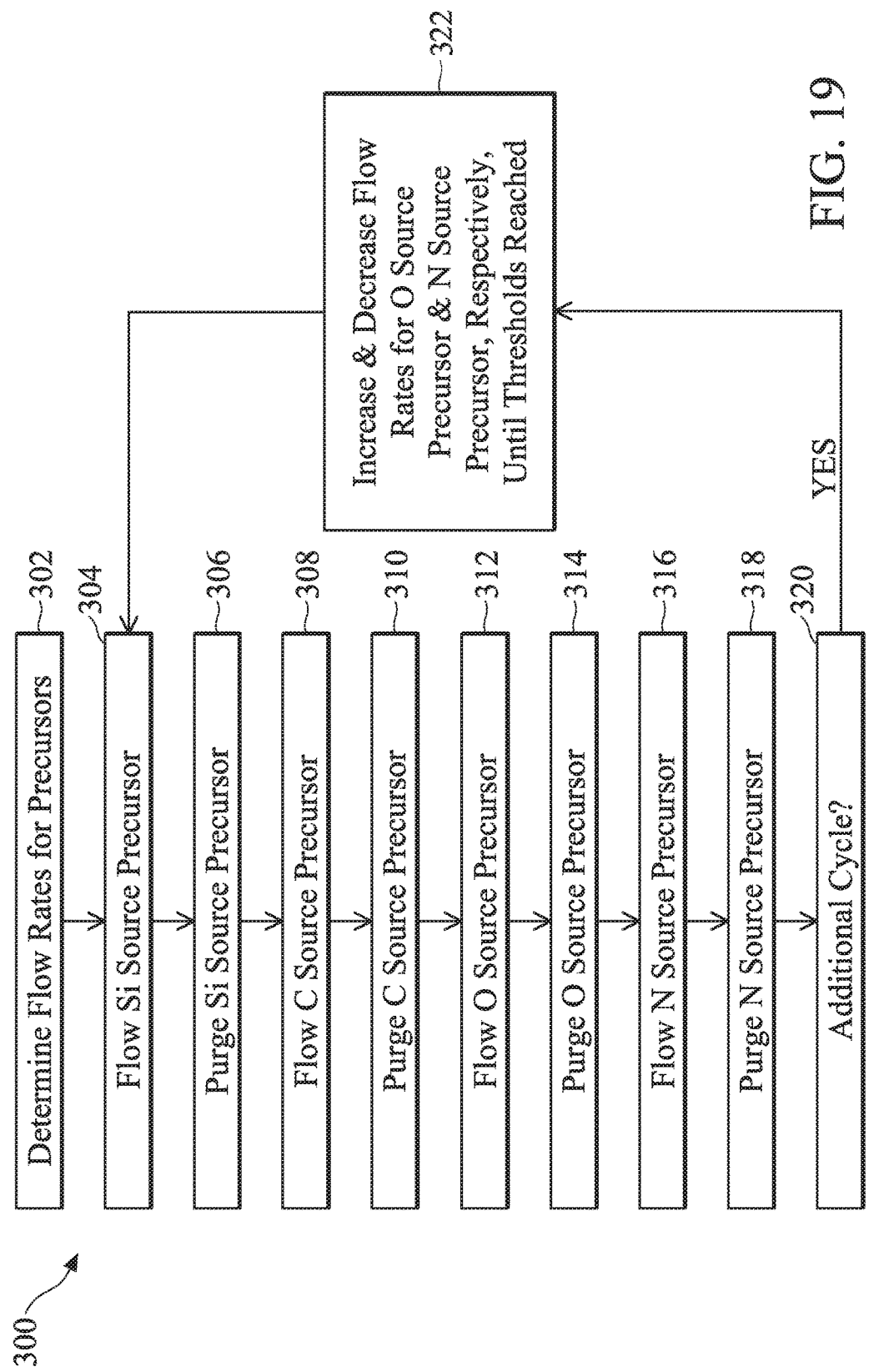
FIG. 19 is a process flow for forming a surface modification layer in accordance with some embodiments.

FIG. 19 is a process flow 300 for forming a surface modification layer, such as in operation 202 of process flow 200, in accordance with some embodiments. The process flow 300, in this example, is an ALD process. As will become apparent, the surface modification layer formed by the process flow 300 may be $SiO_xCN_y$, with varying concentrations of oxygen and nitrogen.

In operation 302, initial precursor flow rates are determined for forming the surface modification layer. The precursors include a silicon (Si) source precursor gas, a carbon (C) source precursor gas, an oxygen (O) source precursor gas, and a nitrogen (N) source precursor gas. In some examples, the silicon source precursor is hexachlorodisilane (HCD, $Si_2Cl_6$) or another precursor; the carbon source precursor is propene ($C_3H_6$) or another precursor; the oxygen source precursor is oxygen ($O_2$) or another precursor; and the nitrogen source precursor is ammonia ($NH_3$) or another precursor.

Operations 304 through 318 illustrate a cycle of the ALD process. The cycle includes alternating flow (or pulse) and purge operations, where each precursor is flowed (or pulsed) and subsequently purged at least once during the cycle. In operation 304, the silicon source precursor is flowed in an ALD tool chamber into which the substrate (e.g., on which the device structure is formed, e.g., as illustrated in FIGS. 5A-B) is transferred, and subsequently, in operation 306, the silicon source precursor is purged from the ALD tool chamber. In some examples, the silicon source precursor may react with reaction sites available on the substrate before being purged. The reactions may saturate the reaction sites, or the silicon source precursor may not react with some reaction sites available on the substrate, in some examples. Similarly, in operation 308, the carbon source precursor is flowed in the ALD tool chamber, and subsequently, in operation 310, the carbon source precursor is purged from the ALD tool chamber. In some examples, the carbon source precursor may react with reaction sites available on the substrate before being purged. The reactions may saturate the reaction sites, or the carbon source precursor may not react with some reaction sites available on the substrate, in some examples.

In operation 312, the oxygen source precursor is flowed in the ALD tool chamber, and subsequently, in operation 314, the oxygen source precursor is purged from the ALD tool chamber. In some examples, the oxygen source precursor may react with reaction sites available on the substrate before being purged. In some examples, at least in an initial cycle(s) of the ALD process, the reactions do not saturate the reaction sites available on the substrate, and the oxygen source precursor does not react with some reaction sites available on the substrate. Saturation can be prevented by controlling a flow rate and duration of the flow (or pulse) in operation 312. By controlling the flow rate and duration, insufficient oxygen source precursor may be available to saturate the reaction sites available on the substrate, for example. This can permit a concentration of oxygen that results from such cycle(s) to be lower than if the oxygen source precursor was permitted to saturate the reaction sites available on the substrate.

In operation 316, the nitrogen source precursor is flowed in the ALD tool chamber, and subsequently, in operation 318, the nitrogen source precursor is purged from the ALD tool chamber. In some examples, the nitrogen source precursor may react with reaction sites available on the substrate before being purged. The reactions may saturate the reaction sites, or the nitrogen source precursor may not react with some reaction sites available on the substrate, in some examples.

After operation 318, a determination is made, in operation 320, whether additional cycles are to be performed (e.g., by determining whether a number of cycles for a recipe have been performed to achieve a target thickness). If so, in operation 322, the flow rate for the oxygen source precursor is determined to be increased, and the flow rate for the nitrogen source precursor is determined to be decreased. Then, another cycle is performed using the determined flow rates of the oxygen source precursor and the nitrogen source precursor. By increasing the flow rate for the oxygen source precursor, a concentration of oxygen formed from the cycle (s) using the increased flow rate can be increased relative to a concentration(s) of oxygen formed from a previous cycle (s) using a lower flow rate(s). Conversely, by decreasing the flow rate for the nitrogen source precursor, a concentration of nitrogen formed from the cycle(s) using the decreased flow rate can be decreased relative to a concentration(s) of nitrogen formed from a previous cycle(s) using a higher flow rate(s). By increasing the flow rate of the oxygen source precursor, an increasing concentration gradient of oxygen can be formed in the surface modification layer, and by decreasing the flow rate of the nitrogen source precursor, a decreasing concentration gradient of nitrogen can be formed in the surface modification layer. In some examples, at least in a later cycle(s) of the ALD process, the reactions with the nitrogen source precursor do not saturate the reaction sites available on the substrate, and the nitrogen source precursor does not react with some reaction sites available on the substrate, which is generally caused by the decreased flow rate for the nitrogen source precursor. Saturation can be prevented by controlling a flow rate and duration of the flow (or pulse). By controlling the flow rate and duration, insufficient nitrogen source precursor may be available to saturate the reaction sites available on the substrate, for example.

The increase and decrease may occur until some threshold is reached, as indicated in operation 322. For example, a determined increased flow rate of the oxygen source precursor may saturate the available reaction sites on the substrate, and hence, further increase generally would not increase a concentration of oxygen formed in the surface modification layer. Further, for example, a desired concentration may be reached based on a given flow rate, such that further increases or decreases may not be desired.

Although the increase and decrease in the flow rates for the oxygen source precursor and the nitrogen source precursor are indicated for each cycle in the process flow 300 of FIG. 19, such an increase and decrease may occur at various intervals of cycles, for example, and the increase and decrease may occur between different cycles, for example. The increase and decrease may occur periodically after a predetermined number of cycles, or may occur non-periodically.

Figure 20:
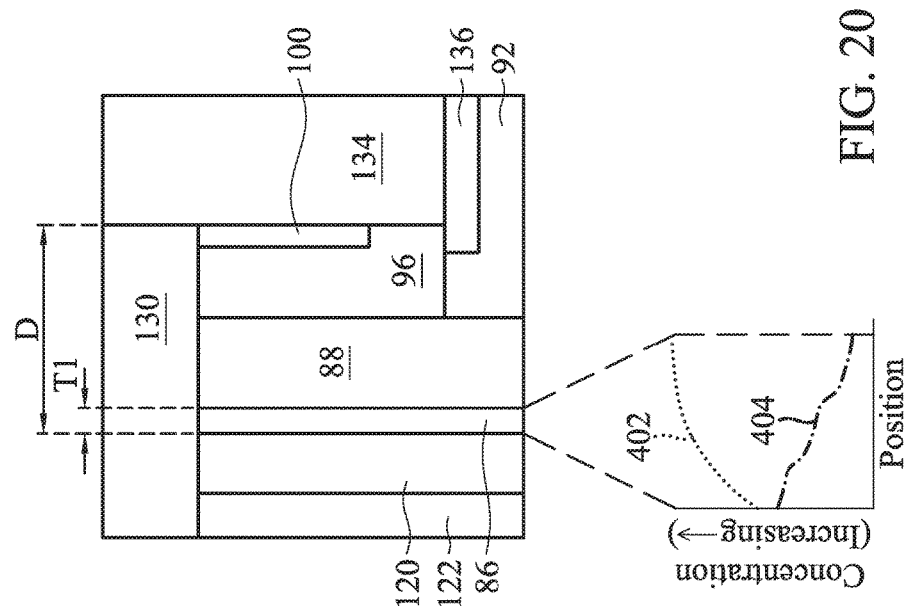
FIG. 20 is a cross-sectional view of a portion of the intermediate structure of FIG. 17A to illustrate additional details of a surface modification layer formed according to the process flow of FIG. 19 in accordance with some embodiments.

FIG. 20 illustrates a cross-sectional view of a portion of the intermediate structure of FIG. 17A to illustrate additional details of a surface modification layer 86 formed according to the process flow 300 of FIG. 19 in accordance with some embodiments. Although various examples described here and below are described in the context of FIG. 17A in a replacement gate process, such description is also applicable in the context of a gate-first process, such as in FIG. 13A.

The surface modification layer 86 has an increasing oxygen concentration gradient 402 and a decreasing nitrogen concentration gradient 404. The concentration gradients 402 and 404 are formed increasing and decreasing by increasing and decreasing the flow rates of the oxygen source precursor and the nitrogen source precursor, respectively, as described with respect to FIG. 19. The portion of the surface modification layer 86 most proximate to the sidewall surface of the replacement gate structure (e.g., sidewall of the conformal layer 120) is nitrogen-rich using the process flow 300 of FIG. 19, for example. The portion of the surface modification layer 86 most proximate to the sidewall surface of the replacement gate structure can have a concentration of nitrogen, for example, in a range from about 0 atomic percent to about 40 atomic percent. With this portion of the surface modification layer 86 being nitrogen-rich, other portions of a gate spacer (e.g., multi-layer gate spacer) can be protected from processing, such as an etch process to remove a dummy gate stack in a replacement gate process.

In some examples, the ALD process of the process flow 300 of FIG. 19 can be performed in a range from 10 cycles to 30 cycles, such as 18 cycles. In some examples, a thickness T1 of the surface modification layer 86 (e.g., in a direction perpendicular to sidewall surface of the replacement gate structure) can be in a range from about 0 Å to about 30 Å, such as about 30 Å. The thickness T1 of the surface modification layer 86 can be in a range from about 0 percent to about 30 percent, such as about 30 percent of a dimension D between the sidewall of the replacement gate structure and a nearest surface of a conductive feature 134. Other numbers of cycles and/or different processes may be implemented to form a surface modification layer 86, and/or the surface modification layer 86 may have different thicknesses.

Figure 21:
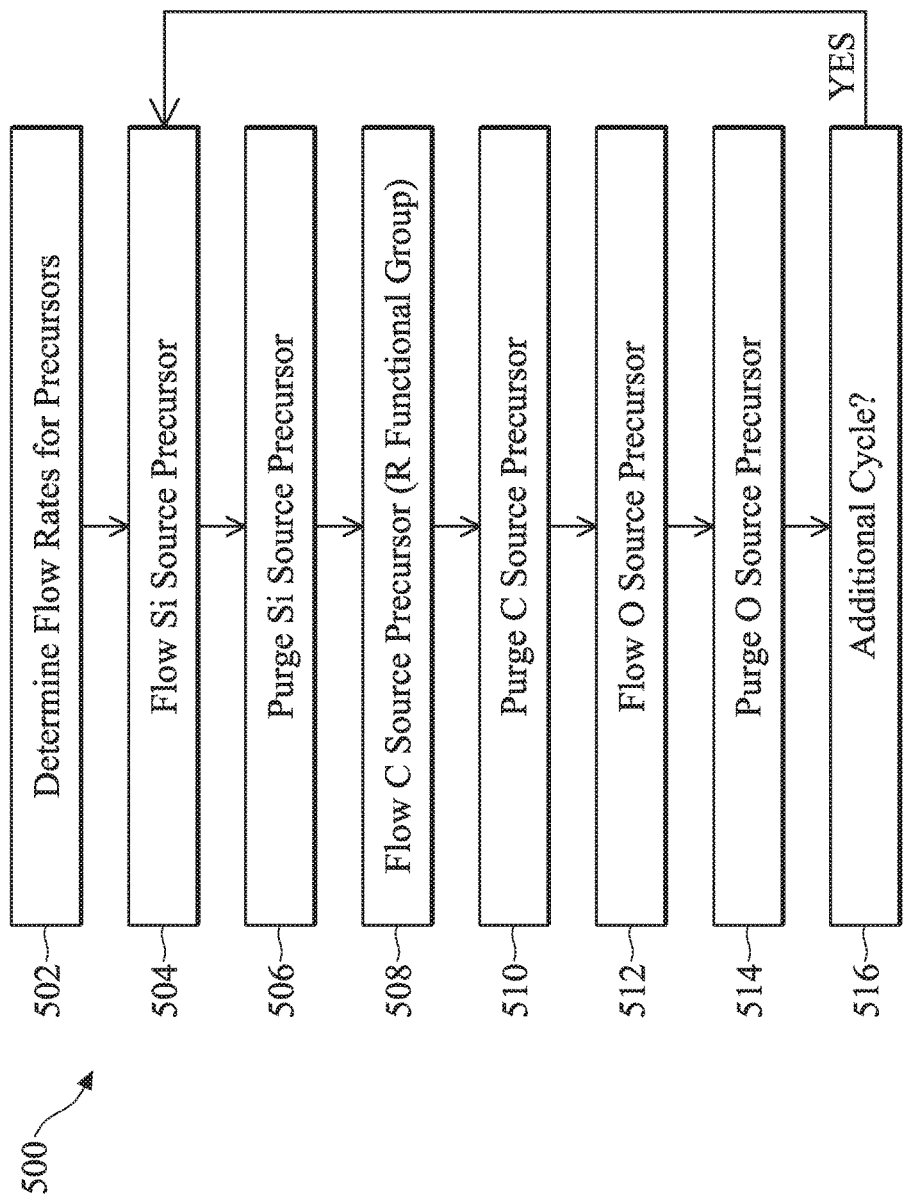
FIG. 21 is a process flow for forming a low-k gate spacer layer in accordance with some embodiments.

FIG. 21 is a process flow 500 for forming a low-k gate spacer layer, such as in operation 204 of process flow 200, in accordance with some embodiments. The process flow 500, in this example, is an ALD process. As will become apparent, the low-k gate spacer layer formed by the process flow 500 may be silicon oxynitride (SiON).

In operation 502, precursor flow rates are determined for forming the low-k gate spacer layer. The precursors include a silicon (Si) source precursor gas, a carbon (C) source precursor gas (which includes an R functional group), and an oxygen (O) source precursor gas. In some examples, the silicon source precursor is hexachlorodisilane (HCD, $Si_2Cl_6$) or another precursor; the carbon source precursor is triethylamine (TEA, $C_6H_{15}N$) or another precursor; and the oxygen source precursor is oxygen ($O_2$) or another precursor.

Operations 504 through 514 illustrate a cycle of the ALD process. The cycle includes alternating flow (or pulse) and purge operations, where each precursor is flowed (or pulsed) and subsequently purged at least once during the cycle. In operation 504, the silicon source precursor is flowed in an ALD tool chamber into which the substrate (e.g., on which the device structure is formed, e.g., as illustrated in FIGS. 5A-B) is transferred, and subsequently, in operation 506, the silicon source precursor is purged from the ALD tool chamber. In some examples, the silicon source precursor may react with reaction sites available on the substrate before being purged. The reactions may saturate the reaction sites, or the silicon source precursor may not react with some reaction sites available on the substrate, in some examples. Similarly, in operation 508, the carbon source precursor with the R functional group is flowed in the ALD tool chamber, and subsequently, in operation 510, the carbon source precursor is purged from the ALD tool chamber. In some examples, the carbon source precursor with the R functional group may react with reaction sites available on the substrate before being purged. The reactions may saturate the reaction sites, or the carbon source precursor may not react with some reaction sites available on the substrate, in some examples. Similarly, in operation 512, the oxygen source precursor is flowed in the ALD tool chamber, and subsequently, in operation 514, the oxygen source precursor is purged from the ALD tool chamber. In some examples, the oxygen source precursor may react with reaction sites available on the substrate before being purged. The reactions may saturate the reaction sites, or the oxygen source precursor may not react with some reaction sites available on the substrate, in some examples.

After operation 514, a determination is made, in operation 516, whether additional cycles are to be performed. If so, another cycle is performed. Any number of cycles can be performed to deposit a low-k gate spacer layer with a desired thickness.

Figure 22:
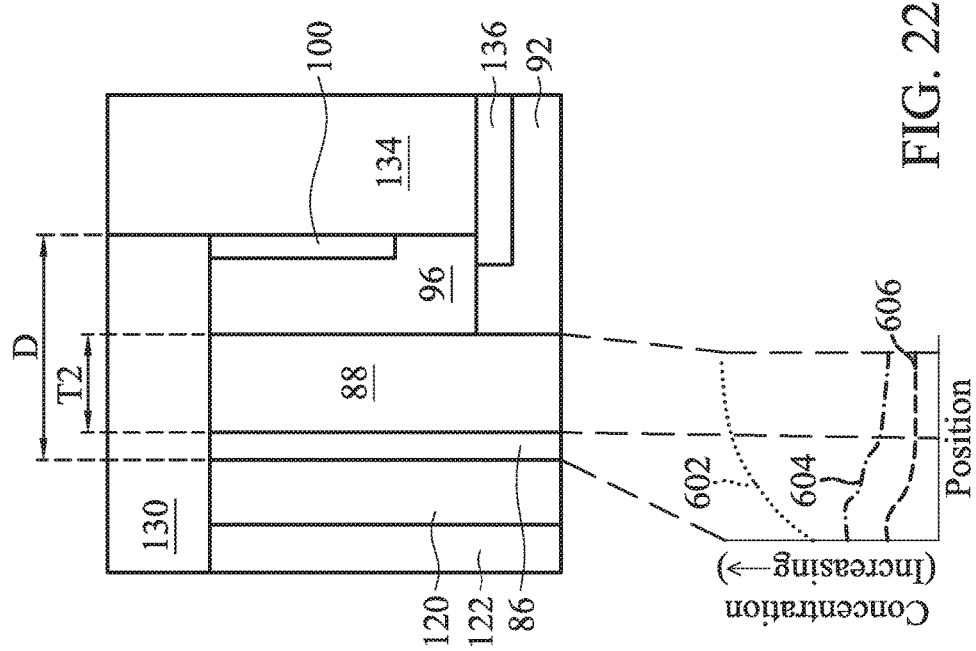
FIG. 22 is a cross-sectional view of a portion of the intermediate structure of FIG. 17A to illustrate additional details of a low-k gate spacer layer formed according to the process flow of FIG. 21 in accordance with some embodiments.

FIG. 22 illustrates a cross-sectional view of a portion of the intermediate structure of FIG. 17A to illustrate additional details of a low-k gate spacer layer 88 formed according to the process flow 500 of FIG. 21 in accordance with some embodiments. The low-k gate spacer layer 88 has an oxygen concentration 602, a nitrogen concentration 604, and a carbon concentration 606. The oxygen concentration 602 in the low-k gate spacer layer 88 is greater than the nitrogen concentration 604 in the low-k gate spacer layer 88, which is greater than the carbon concentration 606 in the low-k gate spacer layer 88. In some examples, the nitrogen concentration 604 in the low-k gate spacer layer 88 does not exceed ten atomic percent, and the carbon concentration 606 in the low-k gate spacer layer 88 does not exceed five atomic percent.

In some examples, the ALD process of the process flow 500 of FIG. 21 can be performed in a range from 50 cycles to 150 cycles, such as 100 cycles. In some examples, a thickness T2 of the low-k gate spacer layer 88 (e.g., in a direction perpendicular to the surface modification layer 86) can be in a range from about 10 Å to about 80 Å, such as about 40 Å. The thickness T2 of the low-k gate spacer layer 88 can be in a range from about 10 percent to about 80 percent, such as about 40 percent, of a dimension D between the sidewall of the replacement gate structure and a nearest surface of a conductive feature 134. Other numbers of cycles and/or different processes may be implemented to form a low-k gate spacer layer 88, and/or the low-k gate spacer layer 88 may have different thicknesses.

Figure 23:
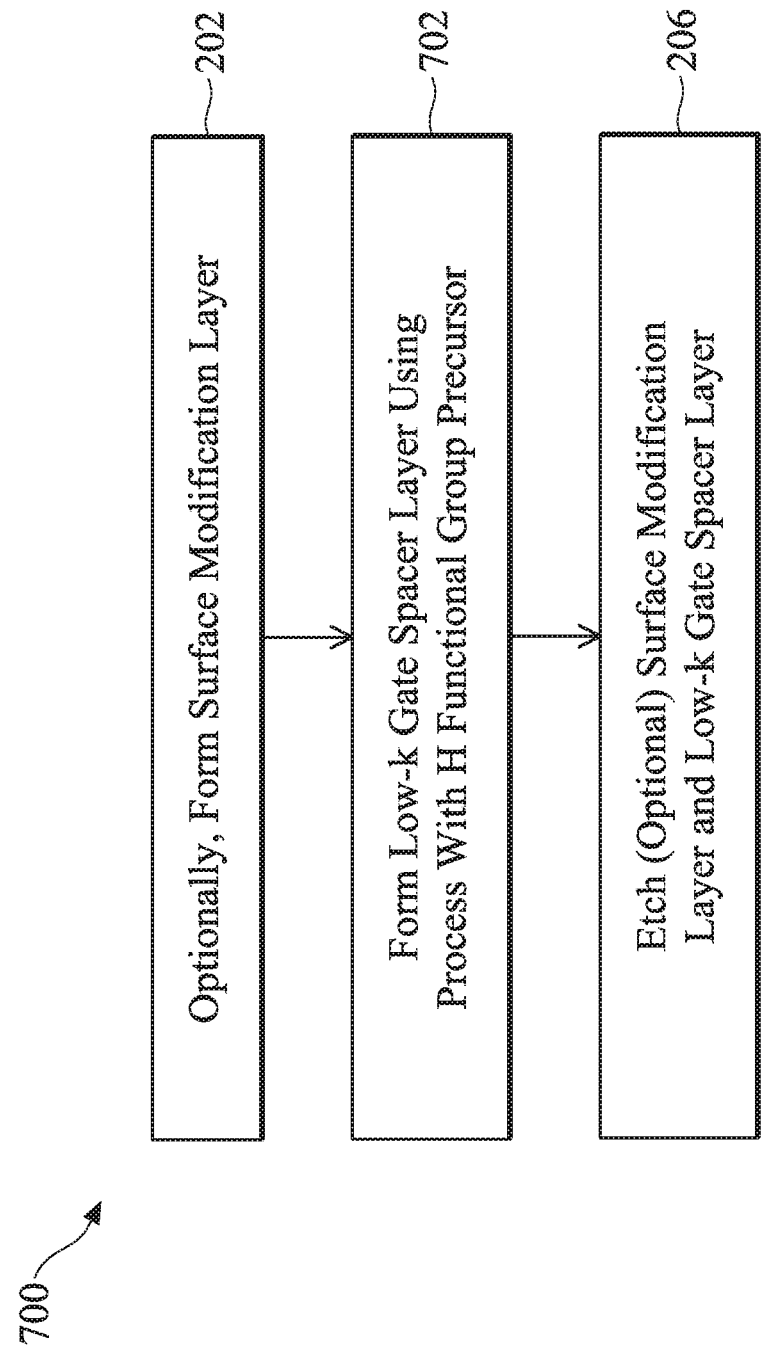
FIG. 23 is another process flow for forming a gate spacer in accordance with some embodiments.

FIG. 23 is a process flow 700 for forming a gate spacer (e.g., a multi-layer gate spacer) in accordance with some embodiments. In operation 202, optionally, a surface modification layer is formed on a device structure, such as generally illustrated in and described with respect to FIGS. 6A and 6B. Operation 202 was previously described. This operation 202 may be omitted. In operation 702, a low-k gate spacer layer is formed using a process that uses an H functional group precursor. The low-k gate spacer layer may be formed on the surface modification layer, if optionally implemented, or on the device structure, for example. Generally, the formation of the low-k gate spacer layer is illustrated in and described with respect to FIGS. 6A and 6B. In operation 206, the low-k gate spacer layer and, if implemented, the surface modification layer are anisotropically etched to form the gate spacer, such as generally illustrated in and described with respect to FIGS. 7A and 7B.

Figure 24:
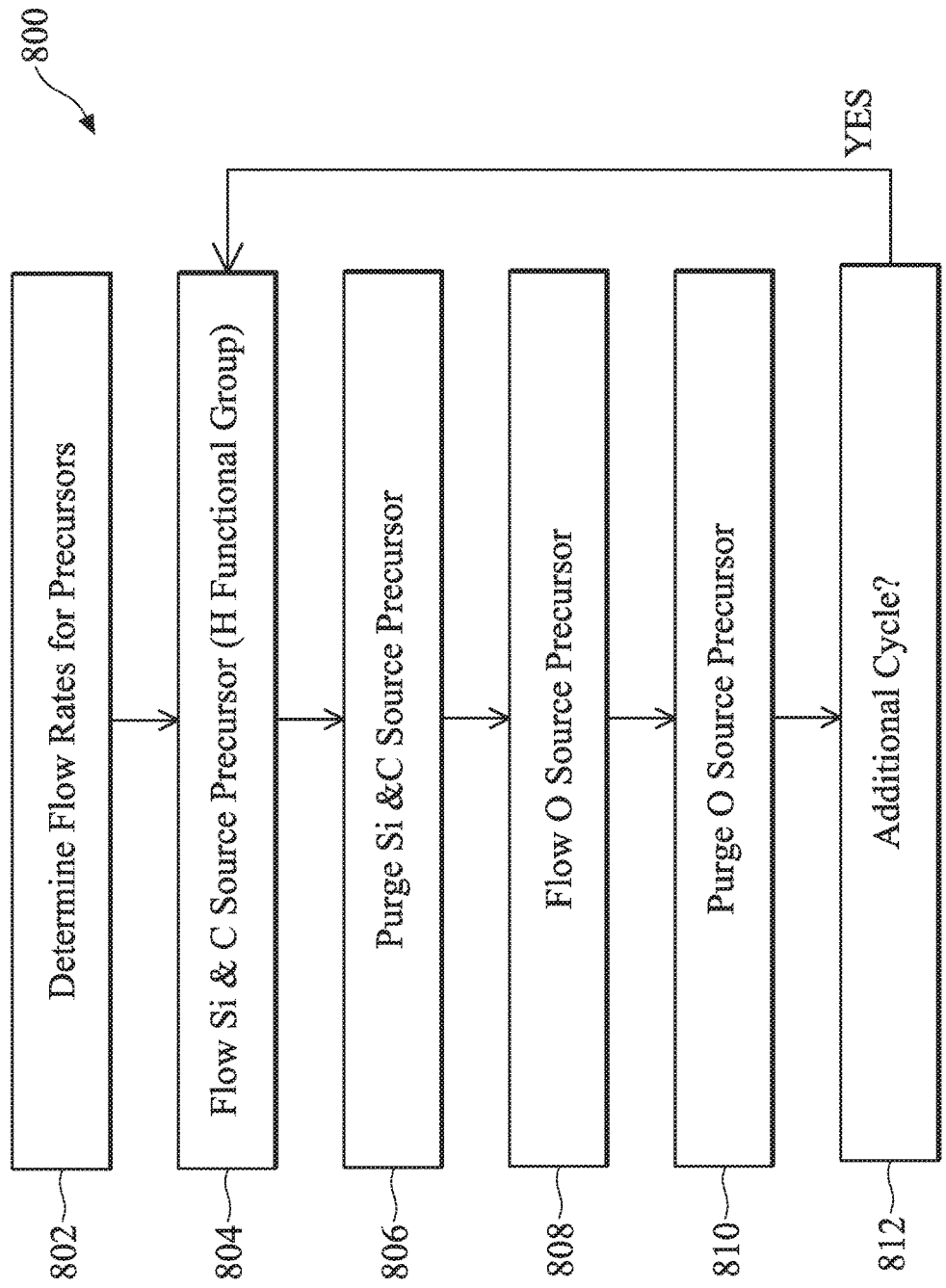
FIG. 24 is another process flow for forming a low-k gate spacer layer in accordance with some embodiments.

FIG. 24 is a process flow 800 for forming a low-k gate spacer layer, such as in operation 702 of process flow 700, in accordance with some embodiments. The process flow 800, in this example, is an ALD process. As will become apparent, the low-k gate spacer layer formed by the process flow 800 may be SiOC.

Figure 25:
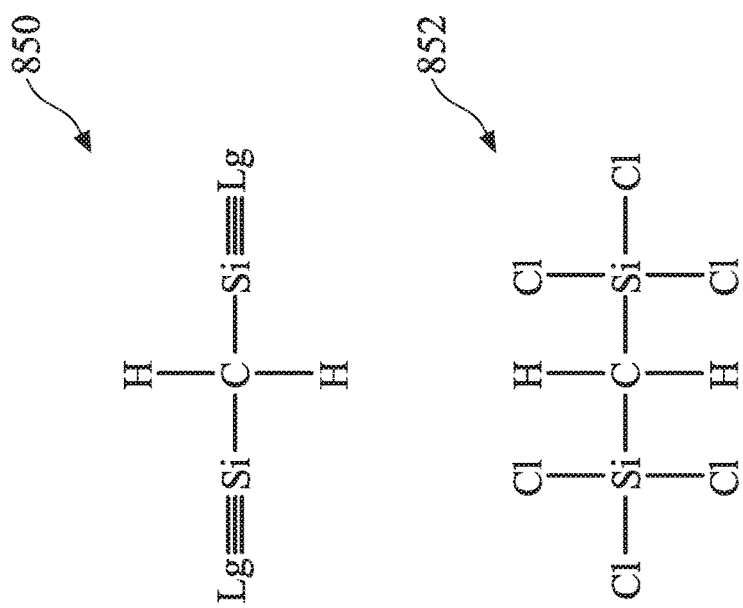
FIG. 25 illustrates a generic chemical structure for a silicon and carbon source precursor with an H functional group and an example specific chemical structure for a silicon and carbon source precursor gas with an H functional group in accordance with some embodiments.

In operation 802, precursor flow rates are determined for forming the low-k gate spacer layer. The precursors include a silicon (Si) and carbon (C) source precursor gas (which includes an H functional group) and an oxygen (O) source precursor gas. In some examples, the silicon and carbon source precursor is silated methane (($SiCl_3$)$_2CH_2$) or another precursor, and the oxygen source precursor is steam ($H_2O$) or another precursor. The ALD process of the process flow 800 does not include a precursor that includes nitrogen, in some examples. FIG. 25 illustrates a generic chemical structure 850 for the silicon and carbon source precursor gas with an H functional group and a specific chemical structure 852 for silated methane (($SiCl_3$)$_2CH_2$). The generic chemical structure 850 includes the H functional group H—C—H bonded to two silicon atoms, which are in turn bonded to a respective leaving group Lg. In the specific chemical structure 852, the leaving group Lg includes three chlorine atoms, such that each silicon atom is bonded to three chlorine atoms.

Returning to FIG. 24, operations 804 through 810 illustrate a cycle of the ALD process. The cycle includes alternating flow (or pulse) and purge operations, where each precursor is flowed (or pulsed) and subsequently purged at least once during the cycle. In operation 804, the silicon and carbon source precursor with the H functional group is flowed in an ALD tool chamber into which the substrate (e.g., on which the device structure is formed, e.g., as illustrated in FIGS. 5A-B) is transferred, and subsequently, in operation 806, the silicon and carbon source precursor is purged from the ALD tool chamber. In some examples, the silicon and carbon source precursor may react with reaction sites available on the substrate before being purged. The reactions may saturate the reaction sites, or the silicon and carbon source precursor may not react with some reaction sites available on the substrate, in some examples. Similarly, in operation 808, the oxygen source precursor is flowed in the ALD tool chamber, and subsequently, in operation 810, the oxygen source precursor is purged from the ALD tool chamber. In some examples, the oxygen source precursor may react with reaction sites available on the substrate before being purged. The reactions may saturate the reaction sites, or the oxygen source precursor may not react with some reaction sites available on the substrate, in some examples.

After operation 810, a determination is made, in operation 812, whether additional cycles are to be performed (e.g., by determining whether a number of cycles for a recipe have been performed to achieve a target thickness). If so, another cycle is performed. Any number of cycles can be performed to deposit a low-k gate spacer layer with a desired thickness.

Figure 26:
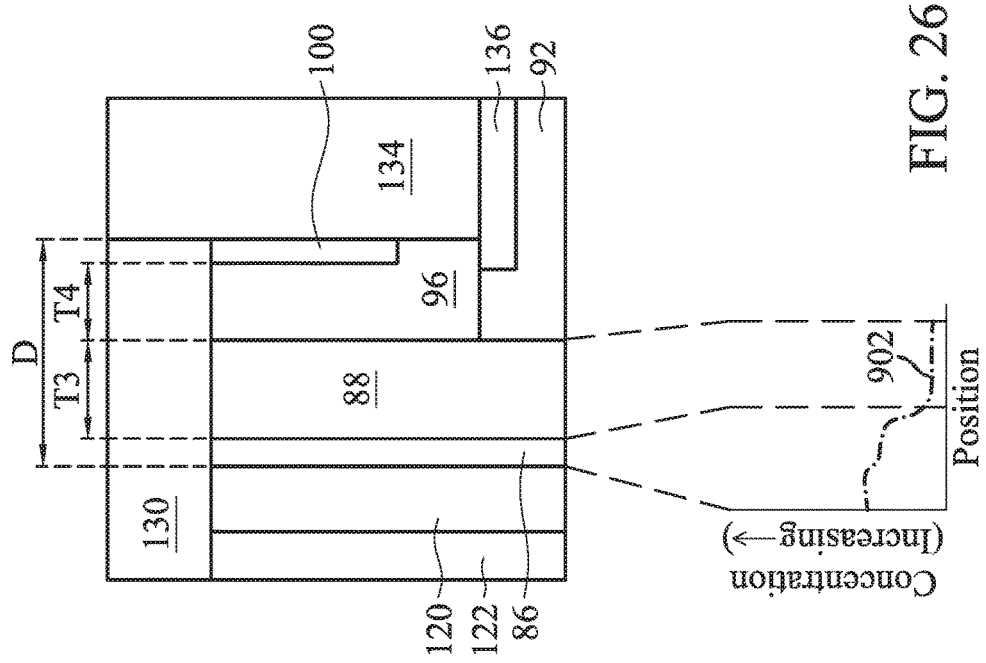
FIG. 26 is a cross-sectional view of a portion of the intermediate structure of FIG. 17A to illustrate additional details of a low-k gate spacer layer formed according to the process flow of FIG. 24 in accordance with some embodiments.

FIG. 26 illustrates a cross-sectional view of a portion of the intermediate structure of FIG. 17A to illustrate additional details of a low-k gate spacer layer 88 formed according to the process flow 800 of FIG. 24 in accordance with some embodiments. The low-k gate spacer layer 88 has a nitrogen concentration 902. In some examples, the nitrogen concentration 902 in the low-k gate spacer layer 88 does not exceed five atomic percent.

In some examples, the ALD process of the process flow 800 of FIG. 24 can be performed in a range from 0 cycles to 150 cycles, such as 70 cycles. In some examples, a thickness T3 of the low-k gate spacer layer 88 (e.g., in a direction perpendicular to the surface modification layer 86) can be in a range from about 0 Å to about 80 Å, such as about 40 Å. The thickness T3 of the low-k gate spacer layer 88 can be in a range from about 0 percent to about 80 percent, such as about 40 percent, of a dimension D between the sidewall of the replacement gate structure and a nearest surface of a conductive feature 134. Other numbers of cycles and/or different processes may be implemented to form a low-k gate spacer layer 88, and/or the low-k gate spacer layer 88 may have different thicknesses.

FIG. 26 further illustrates a thickness T4 of the low-k CESL 96 (e.g., in a direction perpendicular to the low-k gate spacer layer 88), which can be in a range from about 40 Å to about 100 Å, such as about 40 Å. The thickness T4 of the low-k CESL 96 can be in a range from about 40 percent to about 100 percent, such as about 50 percent, of a dimension D between the sidewall of the replacement gate structure and a nearest surface of a conductive feature 134. The low-k CESL 96 may have different thicknesses and may be implemented with any one or more of the surface modification layer 86 and low-k gate spacer layer 88 or without any of those layers.

Some embodiments may achieve advantages. In embodiments implementing a surface modification layer in a gate spacer as described above, the nitrogen-rich portion of the surface modification layer can protect other portions of the gate spacer (e.g., low-k portions), such as in an etch process to remove a dummy gate stack in a replacement gate process. Other embodiments can be implemented to achieve a lower k value in a semiconductor device, such as a FinFET, which can improve performance of the device by lowering the resistance-capacitance (RC) delay value of the device. Other advantages may be achieved by other embodiments.

An embodiment is a method. A dielectric layer is formed using an Atomic Layer Deposition (ALD) process. The dielectric layer has an increasing concentration gradient of oxygen in a direction from an initially formed portion of the dielectric layer to a subsequently formed portion of the dielectric layer. The dielectric layer has a decreasing concentration gradient of nitrogen in the direction. The ALD process includes, for a cycle, flowing an oxygen source precursor at an oxygen flow rate, and flowing a nitrogen source precursor at a nitrogen flow rate; and repeating the cycle a number of times. The oxygen flow rate increases during repeating the cycle the number of times, and the nitrogen flow rate decreases during repeating the cycle the number of times.

Another embodiment is a method. A low-k layer is formed using an Atomic Layer Deposition (ALD) process. The low-k layer has a concentration of oxygen, a first concentration of nitrogen, and a concentration of carbon. The concentration of oxygen is greater than the first concentration of nitrogen, and the first concentration of nitrogen is greater than the concentration of carbon. The ALD process incldues, for a cycle, flowing a carbon source precursor having an R functional group; and repeating the cycle a number of times.

A further embodiment is a method. A low-k layer is formed using an Atomic Layer Deposition (ALD) process. The ALD process includes, for a cycle, flowing a silicon and carbon source precursor having an H functional group; and repeating the cycle a number of times.

A still further embodiment is a method. A gate structure is formed on an active area of a substrate. A gate spacer is formed along a sidewall of the gate structure and on the active area. The active area includes a source/drain region, and the gate spacer is laterally disposed between the source/drain region and the gate structure. A low-k contact etch stop layer is formed conformally along a sidewall of the gate spacer and over the source/drain region of the active area. The low-k contact etch stop layer has a first concentration of oxygen and a first concentration of nitrogen. The first concentration of oxygen is greater than the first concentration of nitrogen.

A yet further embodiment is a structure. The structure includes an active area on a substrate, a gate structure over the active area, and a gate spacer along a sidewall of the gate structure. The active area includes a source/drain region. The gate spacer is disposed laterally between the gate structure and the source/drain region. The gate spacer includes a surface modification layer along the sidewall of the gate structure, and a low-k layer on the surface modification layer. The surface modification layer has a first concentration of nitrogen that decreases away from the gate structure.

Another embodiment is a structure. The structure includes an active area on a substrate, a gate structure over the active area, and a gate spacer along a sidewall of the gate structure. The active area includes a source/drain region. The gate spacer is disposed laterally between the gate structure and the source/drain region. The gate spacer includes a low-k layer having a first concentration of oxygen, a first concentration of nitrogen, and a concentration of carbon. The first concentration of oxygen is greater than the first concentration of nitrogen, and the first concentration of nitrogen is greater than the concentration of carbon.

Another embodiment is a structure. The structure includes an active area on a substrate, a gate structure over the active area, and a gate spacer along a sidewall of the gate structure. The active area includes a source/drain region. The gate spacer is disposed laterally between the gate structure and the source/drain region. The gate spacer includes a low-k layer having a first concentration of nitrogen less than 5 atomic percent of the low-k layer.

Another embodiment is a structure. The structure includes an active area on a substrate, a gate structure over the active area, a gate spacer along a sidewall of the gate structure, and a low-k contact etch stop layer. The active area includes a source/drain region. The gate spacer is disposed laterally between the gate structure and the source/drain region. The low-k contact etch stop layer is along a sidewall of the gate spacer and extends laterally over the source/drain region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a dielectric layer using an Atomic Layer Deposition (ALD) process, the dielectric layer having an increasing concentration gradient of oxygen in a direction from an initially formed portion of the dielectric layer to a subsequently formed portion of the dielectric layer, the dielectric layer having a decreasing concentration gradient of nitrogen in the direction, the ALD process comprising:
   for a cycle:
      flowing an oxygen source precursor at an oxygen flow rate; and
      flowing a nitrogen source precursor at a nitrogen flow rate; and
   repeating the cycle a number of times, wherein the oxygen flow rate increases during repeating the cycle the number of times, and the nitrogen flow rate decreases during repeating the cycle the number of times.

2. The method of claim 1, wherein the dielectric layer is formed along a gate stack.

3. The method of claim 2 further comprising:
   forming a low-k spacer layer on the dielectric layer; and
   forming a gate spacer comprising anisotropically etching the low-k spacer layer and the dielectric layer.

4. The method of claim 1, wherein the initially formed portion of the dielectric layer is nitrogen-rich.

5. The method of claim 1, wherein:
   the ALD process further comprises, for the cycle:
      flowing a silicon source precursor at a silicon flow rate; and
      flowing a carbon source precursor at a carbon flow rate; and
   the silicon flow rate and the carbon flow rate are constant during repeating the cycle the number of times.

6. The method of claim 5, wherein:
   the silicon source precursor is $Si_2Cl_6$;
   the carbon source precursor is $C_3H_6$;
   the oxygen source precursor is $O_2$; and
   the nitrogen source precursor is $NH_3$.

7. A method of manufacturing a semiconductor device, the method comprising:
   pulsing for a first time a first oxygen source precursor into a deposition chamber at a first flow rate;
   after the pulsing for the first time the first oxygen source precursor, pulsing for a first time a first nitrogen source precursor into the deposition chamber at a second flow rate;
   after the pulsing for the first time the first nitrogen source precursor, pulsing for a second time the first oxygen source precursor at a third flow rate different from the first flow rate; and
   after the pulsing for the second time the first oxygen source precursor, pulsing for a second time the first nitrogen source precursor into the deposition chamber at a fourth flow rate different from the second flow rate, wherein the pulsing the first oxygen source precursor and the pulsing the first oxygen source precursor form a dielectric layer, the dielectric layer having an increasing concentration gradient of oxygen in a first direction and the dielectric layer having a decreasing concentration gradient of nitrogen in the first direction.

8. The method of claim 7, wherein the dielectric layer is formed along a gate stack.

9. The method of claim 8 further comprising:
   forming a low-k spacer layer on the dielectric layer; and
   forming a gate spacer comprising anisotropically etching the low-k spacer layer and the dielectric layer.

10. The method of claim 7, wherein the pulsing for the first time the first nitrogen source precursor forms a nitrogen-rich region.

11. The method of claim 7, further comprising:
    pulsing a silicon source precursor at a silicon flow rate; and
    pulsing a carbon source precursor at a carbon flow rate, wherein the silicon flow rate and the carbon flow rate are constant during each pulse.

12. The method of claim 11, wherein:
    the silicon source precursor is $Si_2Cl_6$;
    the carbon source precursor is $C_3H_6$;
    the first oxygen source precursor is $O_2$; and
    the first nitrogen source precursor is $NH_3$.

13. A method of manufacturing a semiconductor device, the method comprising:
- initiating an atomic layer deposition process to form a dielectric layer by initiating a first pulse of $Si_2Cl_6$ into a deposition chamber;
- purging the deposition chamber;
- initiating a first pulse of $C_3H_6$ into the deposition chamber;
- purging the deposition chamber;
- initiating a first pulse of $O_2$ into the deposition chamber at a first oxygen flow rate;
- purging the deposition chamber;
- initiating a first pulse of $NH_3$ into the deposition chamber at a first nitrogen flow rate;
- purging the deposition chamber;
- initiating a second pulse of $Si_2Cl_6$ into the deposition chamber;
- purging the deposition chamber;
- initiating a second pulse of $C_3H_6$ into the deposition chamber;
- purging the deposition chamber;
- initiating a second pulse of $O_2$ into the deposition chamber at a second oxygen flow rate higher than the first oxygen flow rate;
- purging the deposition chamber; and
- initiating a second pulse of $NH_3$ into the deposition chamber at a second nitrogen flow rate less than the first nitrogen flow rate.

14. The method of claim 13, wherein the atomic layer deposition process deposits a dielectric layer along a gate stack.

15. The method of claim 14, further comprising:
- forming a low-k spacer layer on the dielectric layer; and
- forming a gate spacer comprising anisotropically etching the low-k spacer layer and the dielectric layer.

16. The method of claim 15, wherein the dielectric layer has an increasing concentration gradient of oxygen.

17. The method of claim 16, wherein the dielectric layer has a decreasing concentration gradient of nitrogen.

18. The method of claim 13, wherein a flow rate of each pulse of $C_3H_6$ is constant.

19. The method of claim 13, wherein the initiating the first pulse of $NH_3$ into the deposition chamber forms a nitrogen-rich region.

20. The method of claim 13, wherein a flow rate of each pulse of $Si_2Cl_6$ is constant.

* * * * *